(12) United States Patent
Lee et al.

(10) Patent No.: US 8,604,550 B2
(45) Date of Patent: Dec. 10, 2013

(54) SEMICONDUCTOR DEVICES INCLUDING GATE STRUCTURE AND METHOD OF FABRICATING THE SAME

(75) Inventors: Kwang-Wook Lee, Seongnam-si (KR); Jae-Jik Baek, Seongnam-si (KR); In-Seak Hwang, Suwon-si (KR); Seok-Woo Nam, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 105 days.

(21) Appl. No.: 13/097,409

(22) Filed: Apr. 29, 2011

(65) Prior Publication Data

US 2011/0284968 A1 Nov. 24, 2011

(30) Foreign Application Priority Data

May 19, 2010 (KR) ........................ 10-2010-0047063

(51) Int. Cl.
*H01L 29/772* (2006.01)
(52) U.S. Cl.
USPC ................... 257/368; 257/410; 257/E29.242
(58) Field of Classification Search
USPC .................................. 257/368, 410, E29.242
See application file for complete search history.

(56) References Cited

U.S. PATENT DOCUMENTS

| | | | | |
|---|---|---|---|---|
| 6,015,737 A | * | 1/2000 | Tokura et al. | 438/270 |
| 6,963,108 B1 | * | 11/2005 | Kang et al. | 257/330 |
| 7,381,649 B2 | * | 6/2008 | Chen et al. | 438/700 |
| 7,602,013 B2 | | 10/2009 | Miyano et al. | |
| 2007/0007571 A1 | | 1/2007 | Lindsay et al. | |
| 2009/0045456 A1 | * | 2/2009 | Chen et al. | 257/327 |
| 2009/0065809 A1 | | 3/2009 | Yamakawa | |

FOREIGN PATENT DOCUMENTS

| | | |
|---|---|---|
| JP | 2007-019513 | 1/2007 |
| JP | 2007-281280 | 10/2007 |
| JP | 2008-193060 | 8/2008 |
| KR | 1020090107401 | 10/2009 |

* cited by examiner

*Primary Examiner* — Whitney T Moore
(74) *Attorney, Agent, or Firm* — F. Chau & Associates, LLC

(57) ABSTRACT

A semiconductor device includes a semiconductor substrate having at least two oblique side surfaces and a first bottom surface in a recessed portion. A gate insulating layer is formed on the recessed portion. A gate electrode is formed on the gate insulating layer. A channel region is formed below the gate electrode. Gate spacers are formed on side surfaces of the gate electrode.

18 Claims, 32 Drawing Sheets

SEMICONDUCTOR DEVICES INCLUDING GATE STRUCTURE AND METHOD OF FABRICATING THE SAME

CROSS-REFERENCE TO RELATED APPLICATION

This application claims priority under 35 U.S.C. §119 to Korean Patent Application No. 10-2010-47063 filed on May 19, 2010, the disclosure of which is hereby incorporated by reference in its entirety.

BACKGROUND

1. Field

Embodiments of the inventive concept relate to semiconductor devices including a gate structure and methods of fabricating the same.

2. Description of Related Art

As a semiconductor device is highly integrated, degradation in performance caused by scaled down has been on the rise, and continuous efforts to prevent deteriorated performance or improve performance have been made.

SUMMARY

In accordance with an aspect of the inventive concept, a semiconductor device comprises a semiconductor substrate having a top surface and a recessed portion including at least two oblique side surfaces and a first bottom surface therebetween, a gate insulating layer formed on the recessed portion, a gate electrode formed on the gate insulating layer, a channel region below the gate electrode in the semiconductor substrate; and gate spacers formed on side surfaces of the gate electrode, wherein both the bottom surface and the side surfaces of the recessed portion include flat surfaces. The top surface of the semiconductor has a {100}, {010}, {001}, {110}, {101}, or {011} crystal orientation, and the at least two side surfaces have a {111} crystal orientation. The gate insulating layer has less thickness on the bottom surface than those on the side surfaces. The semiconductor substrate further includes a first embedded source/drain region, a second embedded source/drain region, and a channel region disposed between the first and second embedded source/drain regions. The first embedded source/drain region comprises a first upper side surface, a first lower surface and a first intersection line between the first upper and lower surfaces, and the second embedded source/drain region comprises a second upper side surface, a second lower surface and a second intersection line between the second upper and lower surfaces. The first embedded source/drain region is distant from the second embedded source/drain region at a shortest distance between the first and second intersection lines. The first and second intersection lines run along and adjoin the channel region. An intersection angle between the first upper and lower side surfaces is less than 90 degree. The first embedded source/drain region is formed of epitaxially grown SiGe or SiC. Each of the upper and lower surfaces of the first embedded source/drain region comprises a flat surface of {111} crystal orientation.

In accordance with another aspect of the inventive concept, the gate insulating layer includes a first gate insulating layer on the recessed portion and a second gate insulating layer formed on the first gate insulating layer, wherein the first gate insulating layer has less thickness on the bottom surface than those on the side surfaces. The first gate insulating layer is formed of silicon oxide, and the second gate insulating layer is formed of an insulating material having a higher dielectric constant than that of the first gate insulating layer.

In accordance with an aspect of the inventive concept, a method of manufacturing a semiconductor device comprising the steps of forming a recess portion including at least two oblique side surfaces and a bottom surface therebetween in a semiconductor substrate, forming a gate insulating layer formed on the recessed portion, forming a gate electrode formed on the gate insulating layer, forming a channel region below the gate electrode in the semiconductor substrate, and forming gate spacers formed on side surfaces of the gate electrode. The step of forming a recess portion has a resultant side surfaces of a {111} crystal orientation. The step of forming a gate insulating layer has a resultant the gate insulating layer having less thickness on the bottom surface than those on the side surfaces. The step of forming a gate insulation layer includes a step of forming a first gate insulation layer and a step of forming a second gate insulation layer, the first gate insulation layer being formed of silicon dioxide and having less thickness on the bottom surface than those on the side surface, and the second gate insulation layer being formed of an insulating material having a higher dielectric constant than that of the first gate insulating layer. 17. The method of claim 13, further comprising the step of forming a patterned hard etch mask. Dry etching is performed to form a trench in the semiconductor substrate and wet etching is sequentially performed to form a bracket shape on sidewalls of the trench, wherein the bracket shape trench includes a upper flat surface and a lower flat surface and further includes an intersection line between the upper and lower flat surface, the intersection line running along and adjoining the channel region. The bracket shaped trench is filled by selectively growing epitaxial layer. The epitaxial layer is SiGe or SiC.

BRIEF DESCRIPTION OF THE DRAWINGS

The foregoing and other features of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1A:
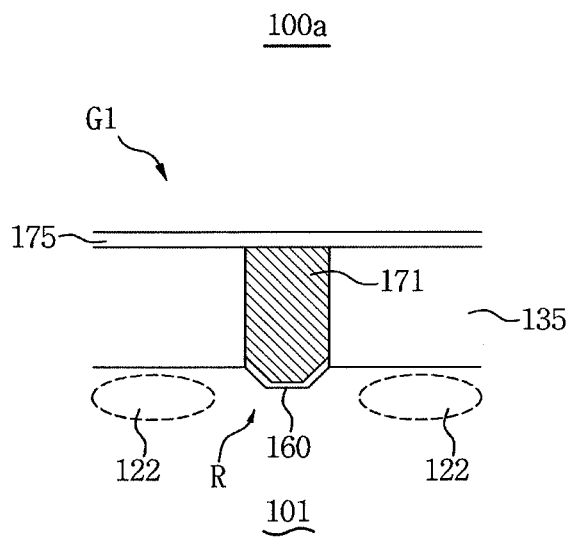
FIGS. 1A to 1D are schematic cross-sectional views of semiconductor devices according to an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
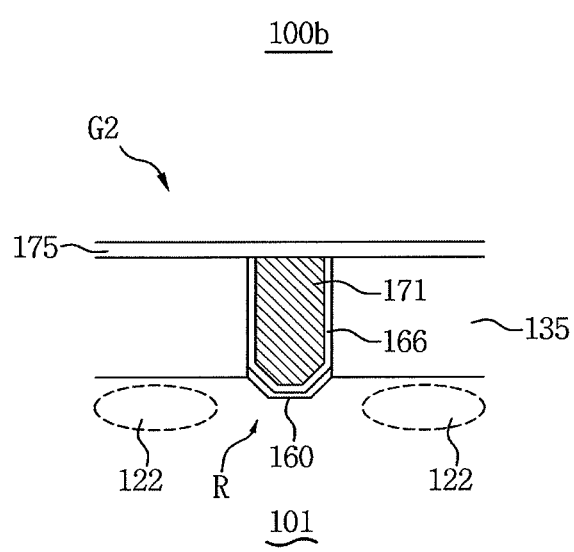
Figure 1C:
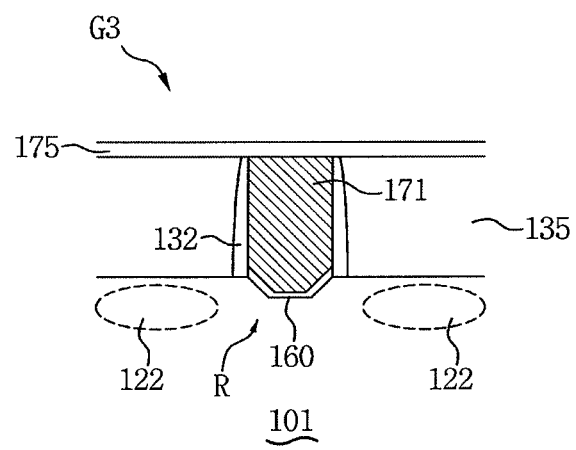
Figure 1D:
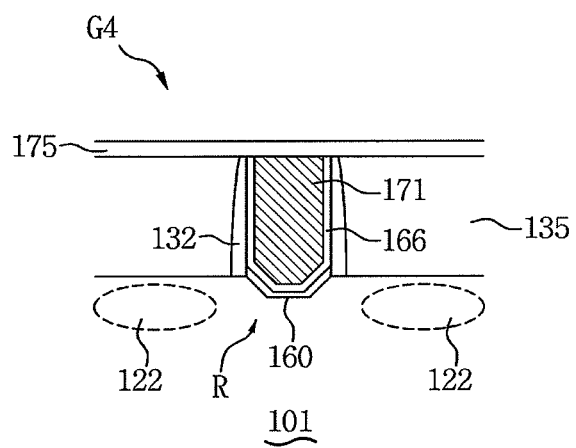
Figure 1E:
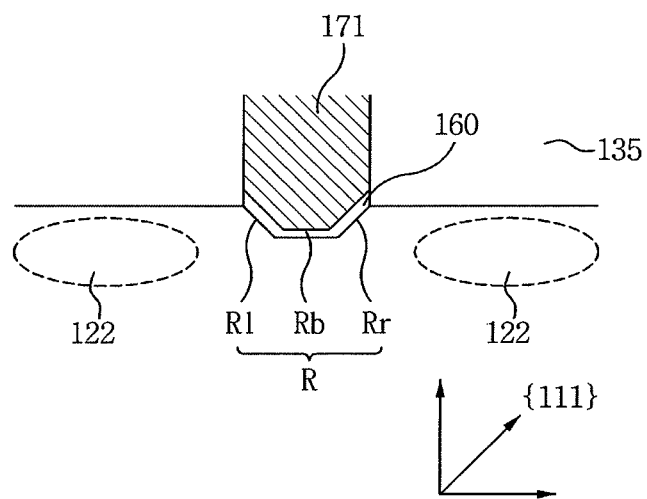
FIGS. 1E and 1F are partially enlarged views of FIGS. 1A to 1D.
Figure 1F:
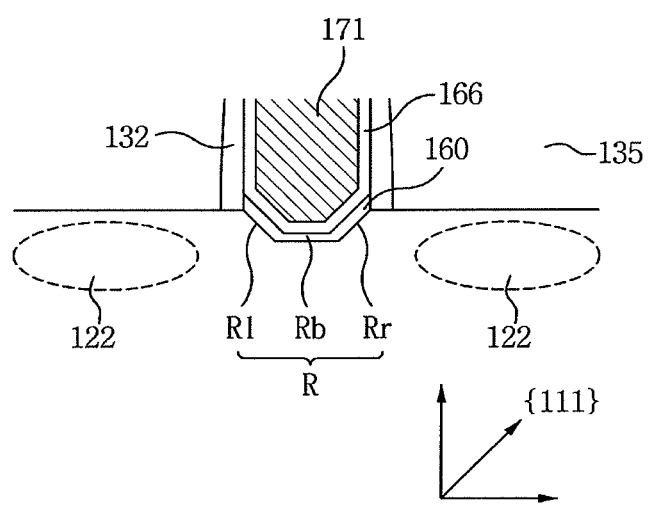

FIGS. 1A to 1D are schematic longitudinal sectional views of semiconductor devices according to embodiments of the inventive concept, and FIGS. 1E and 1F are enlarged views thereof.

Referring to FIG. 1A, a semiconductor device 100a includes a first gate structure G1 formed on a semiconductor substrate 101. The first gate structure G1 includes a recessed portion R, a gate insulating layer 160 formed on the recessed portion R, and a gate electrode 171 formed on the gate insulating layer 160. The recessed portion R will be described in further detail with reference to FIG. 1E. The semiconductor device 100a may further include an interlayer insulating layer 135 surrounding a side surface of the gate electrode 171 and a capping layer 175 covering a top surface of the gate electrode 171.

Referring to FIG. 1B, a semiconductor device 100b according to one embodiment of the inventive concept includes a second gate structure G2 formed on a semiconductor substrate 101. The second gate structure G2 includes a recessed portion R, gate insulating layers 160 and 166 formed on the recessed portion R, and a gate electrode 171 formed on the gate insulating layers 160 and 166. The gate insulating layers 160 and 166 may extend along a sidewall of the gate electrode 171. The recessed portion R will be described in further detail with reference to FIG. 1F. The semiconductor device 100b may further include an interlayer insulating layer 135 surrounding a side surface of the gate electrode 171 and a capping layer 175 covering a top surface of the gate electrode 171.

Referring to FIG. 1C, a semiconductor device 100c according to one embodiment of the inventive concept includes a third gate structure G3 formed on a semiconductor substrate 101. The third gate structure G3 includes a recessed portion R, a gate insulating layer 160 formed on the recessed portion R, a gate electrode 171 formed on the gate insulating layer 160 and a gate spacer 132 formed on sidewalls of the gate electrode 171 and/or the gate insulating layer 160. The recessed portion R will be described in further detail with reference to FIG. 1E. The semiconductor device 100c may further include an interlayer insulating layer 135 surrounding a side surface of the gate electrode 171 and a capping layer 175 covering a top surface of the gate electrode 171.

Referring to FIG. 1D, a semiconductor device 100d according to one embodiment of the inventive concept includes a fourth gate structure G4 formed on a semiconductor substrate 101. The fourth gate structure G4 includes a recessed portion R, gate insulating layers 160 and 166 formed on the recessed portion R, a gate electrode 171 formed on the gate insulating layers 160 and 166 and a gate spacer 132 formed on sidewalls of the gate electrode 171 and/or the gate insulating layers 160 and 166. The recessed portion R will be described in further detail with reference to FIG. 1F. The semiconductor device 100d may further include an interlayer insulating layer 135 surrounding a side surface of the gate electrode 171 and a capping layer 175 covering a top surface of the gate electrode 171.

Referring to FIGS. 1A to 1D, the semiconductor substrate 101 may be a silicon substrate, e.g., a single crystalline silicon substrate of which the crystal orientation may be a {100}, {010}, {001}, {011}, {101} or {110} crystal orientation. The semiconductor devices 100a to 100d may further include source/drain regions 122. The source/drain regions 122 may be formed in the semiconductor substrate 101 arranged at the outside of the gate electrodes 171 and/or the gate spacers 132. Each of the gate structures G1 to G4 may be an NMOS transistor or PMOS transistor. When each of the gate structures G1 to G4 is an NMOS transistor, the semiconductor substrate 101 may correspond to a p-type well region, the source/drain regions 122 may be a region to which n-type impurities are implanted. Alternatively, when each of the gate structures G1 to G4 is a PMOS transistor, the semiconductor substrate 101 may be an n-type well region, and the source/drain regions 122 may be a region to which p-type impurities are implanted. The crystal orientation means a crystal plane orientation throughout the specification.

In FIGS. 1A and 1C, the gate insulating layer 160 may be formed only on a surface of the recessed portion R. The gate insulating layer 160 may be a silicon oxide layer formed by oxidizing a surface of the silicon substrate 101. The side portion of the gate insulating layer 160 may be formed thicker than a bottom portion. This will be described in further detail with reference to FIG. 1E.

In FIGS. 1B and 1D, the gate insulating layers 160 and 166 include a first gate insulating layer 160 and a second gate insulating layer 166. The first gate insulating layer 160 may be formed on the surface of the recessed portion R. The second gate insulating layer 166 may be formed on the first gate insulating layer 160 and a side surface of the gate electrode 171. The second gate insulating layer 166 may include an insulating layer having a higher dielectric constant than the first gate insulating layer 160. For example, the second gate insulating layer 166 may include hafnium oxide, aluminum oxide, tantalum oxide or other insulating materials having a higher dielectric constant than silicon oxides.

In FIGS. 1A to 1D, the gate electrode 171 may be formed on the gate insulating layer 160 and/or the second insulating layer 166. Side surfaces of the gate electrode 171 may be surrounded by the gate spacers 132 and/or the second gate insulating layer 166. The gate electrode 171 may include at least one of metals, metal silicides or metal compounds. For example, the gate electrode 171 may include at least one of TiN, Al, W, Co, Ni, Cu or refractory metals.

In FIGS. 1C and 1D, the gate spacers 132 may be formed on the gate electrode 171. The gate spacers 132, in FIG. 1D, may be formed on outer sidewalls of the second gate insulating layer 166. The outer sidewalls of the gate spacers 132 may be surrounded by a first interlayer insulating layer 135. The upper width of the gate spacers 132 may be narrower than a lower width thereof. Each of the gate spacers 132 may include a flat surface at the top end. The flat surface of each of the gate spacers 132 may be formed at the same level as the top surface of the gate electrode 171. For example, at least two of the surface of the top end of each of the gate spacers 132, the top surface of the gate electrode 171, the surface of the top end of the second gate insulating layer 166 and top surface of the first interlayer insulating layer 135 may have the same level. Having the same level may be understood that the surfaces are disposed along the same horizon or plane. The gate spacers 132 may include silicon nitride or silicon oxynitride.

In FIGS. 1A to 1D, source/drain regions 122 may be doped with boron (B) when each of the gate structures G1 to G4 is for a PMOS transistor transistor. Otherwise, the source/drain regions 122 may include phosphorus and/or arsenic when each of the gate structures G1 to G4 is an NMOS transistor.

Referring to FIGS. 1E and 1F, the recessed portions R of the gate structures G1 to G4 may be formed like a shape of trenches. The recessed portions R may include a bottom surface Rb, a left side surface Rl and a right side surface Rr. The bottom surface Rb may be a flat horizontal surface. Also, the flat surface of the bottom surface Rb may be formed in parallel to the surface of the semiconductor substrate 101. The left side surface Rl and the right side surface Rr may be formed to be oblique to both sides of the bottom surface Rb. For example, when the semiconductor substrate 101 may be one of {100}, {010}, {001}, {011}, {101} or {110} crystal orientation, the left side surface Rl and the right side surface Rr may be a {111} crystal orientation.

The recessed portions R may cause channels of the gate structures G1 to G4 to be lengthened. For example, the channels of the gate structures G1 to G4 may be formed to be extended downward along the recessed portions R. Therefore, a short channel effect of the gate structures G1 to G4 may be prevented or reduced. The technology and effect may be understood with reference to a recessed channel array transistor (RCAT) or buried channel array transistor (BCAT) technique. The recessed portions R may cause the source/drain regions 122 to be formed in an elevated shape, relatively. For example, the source/drain regions 122 may be formed in a similar shape to a structure referred to as elevated source and drain, and effects similar to those brought on by the structure may be anticipated.

The first gate insulating layer 160 formed on the left side surface Rl and/or the right side surface Rr may be thicker than the first gate insulating layer 160 formed on the bottom surface Rb. In the general MOS transistor or gate structure, an electric field is concentrated at a corner portion of a gate electrode. Therefore, the general MOS transistor or gate structure is significantly vulnerable to a leakage current generated at the corner portion of the gate electrode. However, since the first gate insulating layer 160 is formed thick at the corner portion of the gate electrode 171 in the semiconductor device according to the inventive concept, the leakage current may be prevented or significantly reduced. Consequently, the gate structures G1 to G4 including the recessed portion R according to the inventive concept may exhibit a less leakage current and longer channel length, so that performance can be enhanced. In contrast, the second gate insulating layer 166 may be conformably formed as a whole.

Figure 2A:
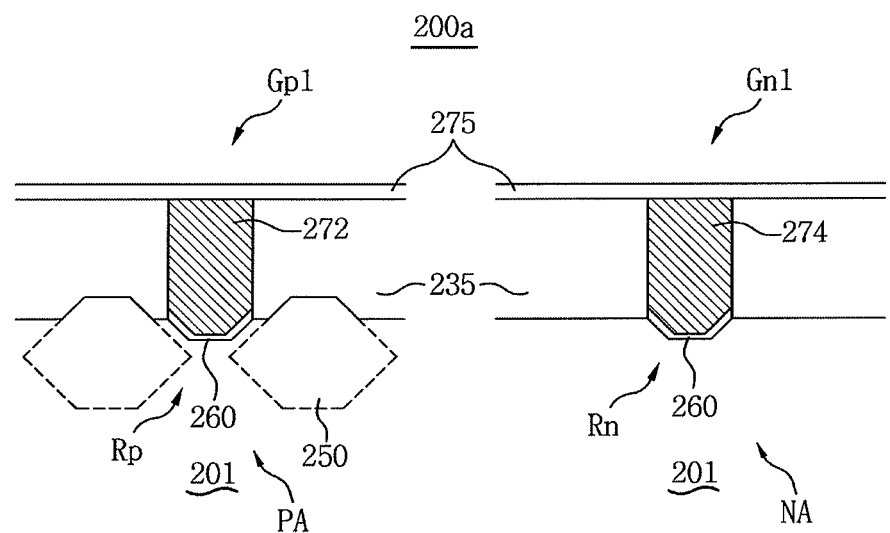
FIGS. 2A to 2D are schematic cross-sectional views of semiconductor devices according to embodiments of an embodiment of the inventive concept.
Figure 2B:
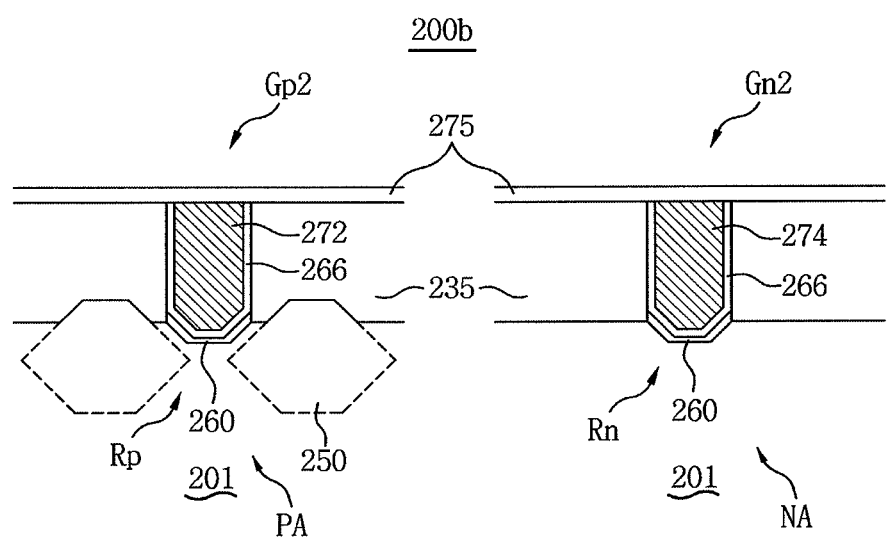
Figure 2C:
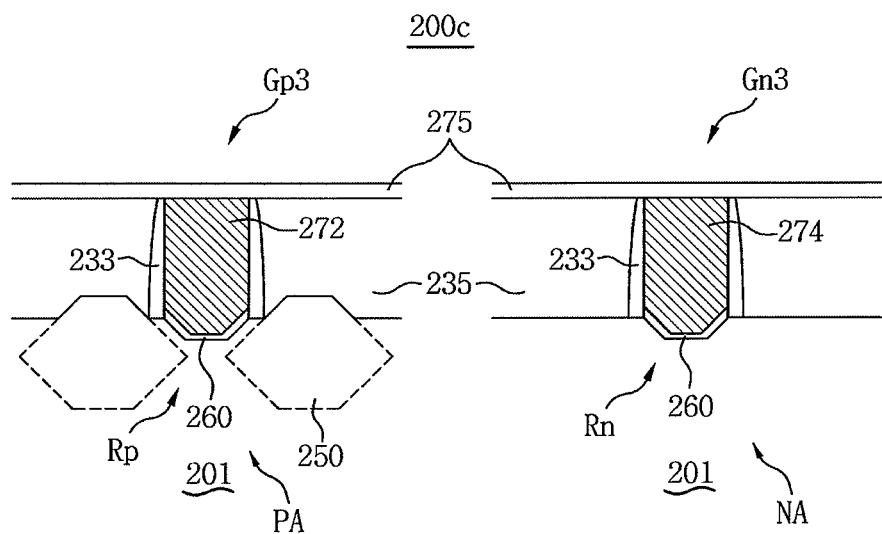
Figure 2D:
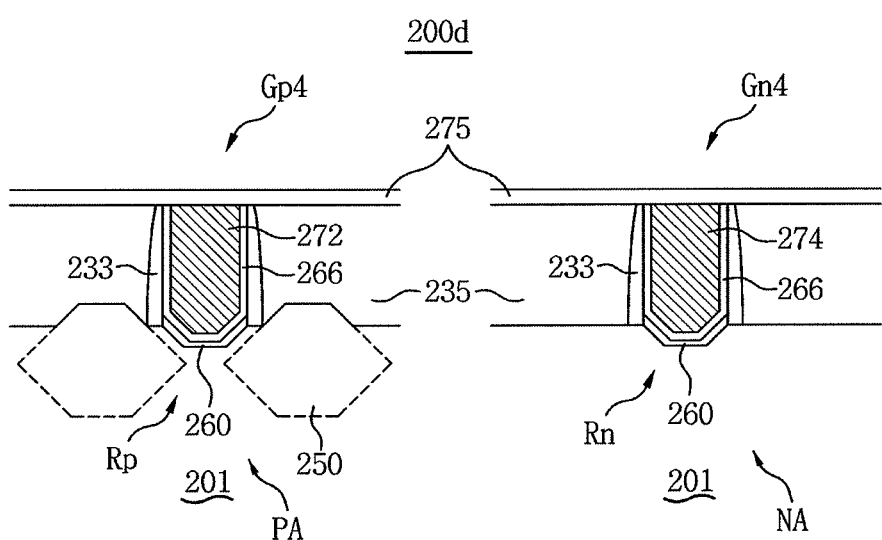
Figure 2E:
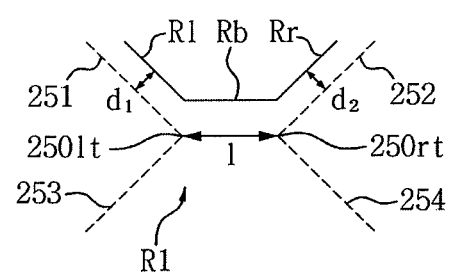
FIG. 2E is a partially enlarged view of FIGS. 2A to 2D.
Figure 3A:
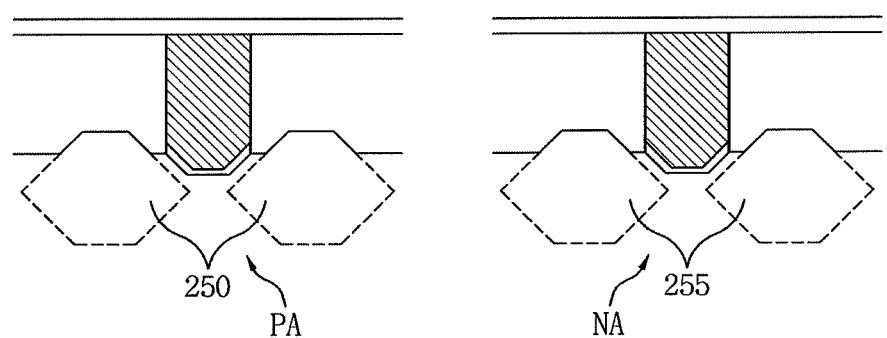
FIGS. 3A to 3D are schematic cross-sectional views of semiconductor devices according to an embodiment of the inventive concept.
Figure 3B:
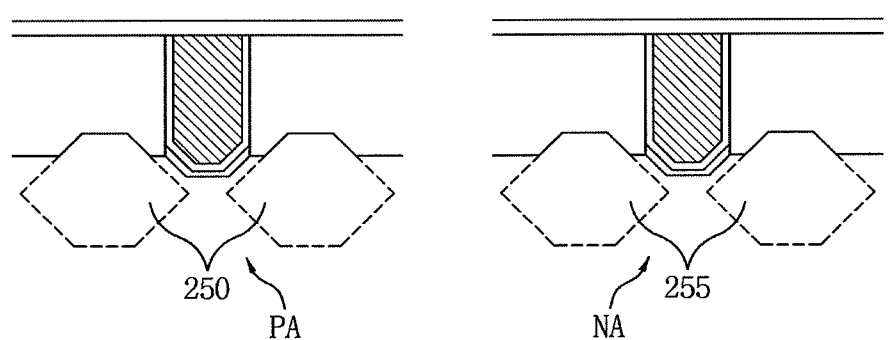
Figure 3C:
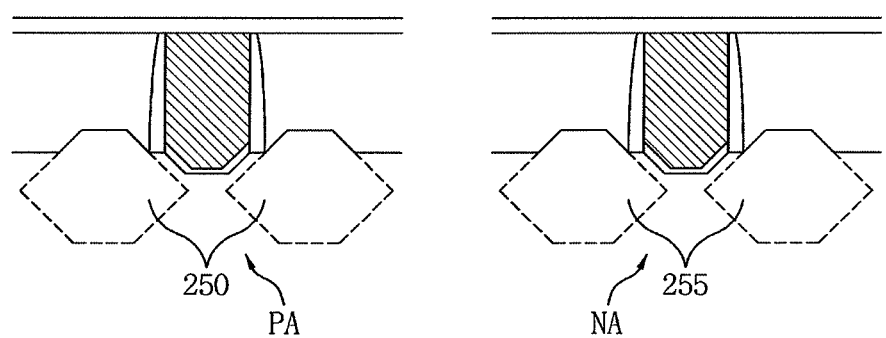
Figure 3D:
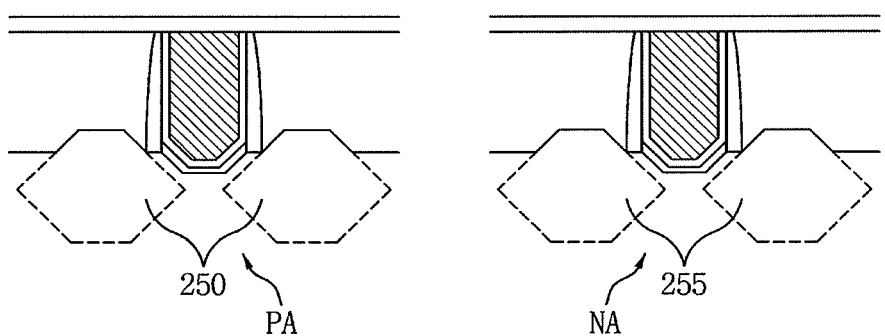

FIGS. 2A to 2D are schematic longitudinal sectional views of semiconductor devices according to embodiments of the inventive concept, and FIG. 2E is a partially enlarged view of a recessed portion.

Referring to FIG. 2A, a semiconductor device 200a according to one embodiment of the inventive concept may include a semiconductor substrate 201 having a PMOS transistor area PA and an NMOS transistor area NA, a first gate structure Gp1 and embedded source/drain regions 250 formed on the PMOS transistor area PA, and a second gate structure Gn1 formed on the NMOS transistor area NA. The first gate structure Gp1 and the second gate structure Gn1 may include first and second recessed portions Rp and Rn, respectively, gate insulating layers 260 formed on the first and second recessed portions Rp and Rn, and first and second gate electrodes 272 and 274 formed on the gate insulating layers 260. The first and second recessed portions Rp and Rn may be further understood with reference to FIGS. 1E and 2E. The semiconductor device 200a may further include an interlayer insulating layer 235 surrounding side surfaces of the first and second gate electrodes 272 and 274 and a capping layer 275 covering top surfaces thereof.

Referring to FIG. 2B, a semiconductor device 200b according to one embodiment of the inventive concept includes a semiconductor substrate 201 having a PMOS transistor area PA and an NMOS transistor area NA, a first gate structure Gp2 and embedded source/drain regions 250 formed on the PMOS transistor area PA, and a second gate structure Gn2 formed on the NMOS transistor area NA. The first gate structure Gp2 and the second gate structure Gn2 may include first and second recessed portions Rp and Rn, respectively, gate insulating layers 260 and 266 formed on the first and second recessed portions Rp and Rn, and first and second gate electrodes 272 and 274 formed on the gate insulating layers 260 and 266. The gate insulating layers 260 and 266 may extend along sidewalls of the first and second gate electrodes 272 and 274. The first and second recessed portions Rp and Rn may be further specifically understood with reference to FIGS. 1F to 2E. The semiconductor device 200b may further include an interlayer insulating layer 235 surrounding side surfaces of the first and second gate electrodes 272 and 274 and a capping layer 275 covering top surfaces thereof.

Referring to FIG. 2C, a semiconductor device 200c according to one embodiment of the inventive concept includes a semiconductor substrate 201 having a PMOS transistor area PA and an NMOS transistor area NA, a first gate structure Gp3 and embedded source/drain regions 250 formed on the PMOS transistor area PA, and a second gate structure Gn3 formed on the NMOS transistor area NA. The first gate structure Gp3 and the second gate structure Gn3 may include first and second recessed portions Rp and Rn, respectively, gate insulating layers 260 formed on the first and second recessed portions Rp and Rn, first and second gate electrodes 272 and 274 formed on the gate insulating layers 260, and gate spacers 233 formed on sidewalls of the first and second gate electrodes 272 and 274. The first and second recessed portions Rp and Rn may be further specifically understood with reference to FIGS. 1E, 1F and 2E. The semiconductor device 200c may further include an interlayer insulating layer 235 surrounding side surfaces of the first and second gate electrodes 272 and 274 and a capping layer 275 covering top surfaces thereof.

Referring to FIG. 2D, a semiconductor device 200d according to the inventive concept includes a semiconductor substrate 201 having a PMOS transistor area PA and an NMOS transistor area NA, a first gate structure Gp4 and embedded source/drain regions 250 formed on the PMOS transistor area PA and a second gate structure Gn4 formed on the NMOS transistor area NA. The first gate structure Gp4 and the second gate structure Gn4 may include first and second recessed portions Rp and Rn, respectively, gate insulating layers 260 and 266 formed on the first and second recessed portions Rp and Rn, first and second gate electrodes 272 and 274 formed on the gate insulating layers 260 and 266, and gate spacers 233 formed on sidewalls of the first and second gate electrodes 272 and 274 and/or the gate insulating layers 260 and 266. The gate insulating layers 260 and 266 may extend along the sidewalls of the first and second gate electrodes 272 and 274. The first and second recessed portions Rp and Rn may be further specifically understood with reference to FIGS. 1F and 2E. The semiconductor device 200d may further include an interlayer insulating layer 235 surrounding side surfaces of the first and second gate electrodes 272 and 274 and a capping layer 275 covering top surfaces thereof.

In FIGS. 2A to 2D, the semiconductor substrate 201, the gate insulating layers 260 and 266, the gate electrodes 272 and 274, and the gate spacers 233 may be understood with reference to FIGS. 1A to 1F and the descriptions thereof.

In FIGS. 2A to 2D, the embedded source/drains regions 250 may be have side surfaces like a shape of a single or twin sigma ($\Sigma$), mountains or angle brackets (< >), or polygon such as a hexagon. The embedded source/drains regions 250 may be formed using an epitaxial growth process. Specifically, the embedded source/drains regions 250 may include a silicon material containing germanium (Ge) or carbon (C). For example, it may be SiGe or SiC. When each of the first gate structures Gp1 to Gp4 is a PMOS transistor, the embedded source/drains regions 250 may include SiGe, and when each of the first gate structures Gp1 to Gp4 is an NMOS transistor, the embedded source/drains regions 250 may include SiC. The SiGe material and the SiC material respectively apply stress to channel regions of the first gate structures Gp1 to Gp4 in the PMOS transistor and NMOS transistor to increase carrier mobility. For example, the SiGe material applies compressive stress to a channel of a PMOS transistor to increase hole mobility, and the SiC material applies tensile stress to a channel of an NMOS transistor to increase electron mobility.

Referring to FIG. 2E, the embedded source/drains regions 250 includes oblique upper side surfaces 251 and 252 and oblique lower side surfaces 253 and 254. The upper side surfaces 251 and 252 may be respectively spaced distances d1 and/or d2 apart from oblique side portions Rl and Rr of the recessed portion R. The oblique upper side surfaces 251 and 252 may be parallel to the oblique side portions Rl and Rr. The distances d1 and d2 may be variously set depending on the design rules, process specifications, etc. The oblique upper side surfaces 251 and 252 and lower side surfaces 253 and 254 of the embedded source/drains regions 250 may be formed to be oblique in the {111} crystal orientation with respect to a surface of the semiconductor substrate 201. When the semiconductor substrate 201 has a top surface of one of a {100}, {010}, {001}, {110}, {101} or {011} crystal orientation, the oblique upper side surfaces 251 and 252 and lower side surfaces 253 and 254 of the source/drain regions 250 may be formed in the {111} crystal orientation.

The oblique upper side surfaces 251 and 252 and lower side surfaces 253 and 254 of the embedded source/drain regions 250 may meet at intersection lines having tips 250$lt$ and 250$rt$, respectively. The tips 250$lt$ and 250$rt$ may be spaced a predetermined distance 1 apart from each other. The predetermined distance 1 may be the shortest distance between the embedded source/drains regions 250.

Locations of the tips 250$lt$ and 250$rt$ relate to the intensity of stress applied to the channel. For example, the tips 250$lt$ and 250*rt* correspond to locations where the greatest magnitude of stress is applied to the semiconductor substrate 201, e.g., a channel region, in a horizontal direction. The channel region adjoining the tips 250*lt* and 250*rt* may receive the strongest stress, and thus the amount of current flow through the channel may improve due to the stress induced mobility enhancement. This may provide beneficial information for improving performance of the transistor. For example, this is because setting appropriate locations of the tips 250*lt* and 250*rt* may have the greatest effect on performance of the transistor.

According to techniques of forming embedded regions, sidewalls of the embedded regions may be vertically formed. For example, components such as the tips 250*lt* and 250*rt* capable of contributing to current flow are not formed on the sidewalls. Although components similar to the tips 250*lt* and 250*rt* are intended to be formed using the general techniques, it is impossible to extend and form embedded regions in a horizontal direction since an ion implantation process causes bonding damage in the semiconductor substrate 201 in a vertical direction. When the embedded regions are forced to expand in a horizontal direction, the ion implantation process may cause the deeper embedded regions to be formed in a vertical direction, and this may cause warpage of the semiconductor substrate 201. In order to prevent the warpage of the semiconductor substrate 201 and to form the components similar to the tips 250*lt* and 250*rt*, a method of forming the embedded regions without implanting ions may be taken into account. However, since source/drain regions should have conductivity, ions must be implanted. Alternatively, implanting ions after forming the embedded regions is not compatible with a process of forming cell transistors, and requires complicated processes. The inventive concept may enable locations of the tips 250*lt* and 250*rt* to be arbitrarily set, and in particular, enable the tips 250*lt* and 250*rt* to be formed at a desired depth from the bottom surface Rb of the recessed portion Rl. In particular, it enables the tips 250*lt* and 250*rt* to be formed at a shallow portion. Therefore, the inventive concept may be variously applied according to the design standard and/or process standard of the semiconductor device 200. For example, distances d1 and d2 between the recessed portion Rl and the source/drain regions 250 and/or the distance 1 between the tips 250*lt* and 250*rt* may be appropriately adjusted.

FIGS. 3A to 3D are schematic cross-sectional views of semiconductor devices according to embodiments of the inventive concept. Specifically, FIGS. 3A to 3D may be compared with FIGS. 2A to 2D, respectively, to be understood.

Referring to FIGS. 3A to 3D, compared to the semiconductor devices 200*a* to 200*d* illustrated in FIGS. 2A to 2D, semiconductor devices 300*a* to 300*d* according to embodiments of the inventive concept may further include second embedded source/drain regions 255 formed on the NMOS transistor area NA. The first embedded source/drain regions 250 may be formed on the PMOS transistor area PA, and may include SiGe. The second embedded source/drain regions 255 may be formed on the NMOS transistor area NA and may include SiC. Other components that are not described may be sufficiently understood based on the whole descriptions of the specification.

Figure 4A:
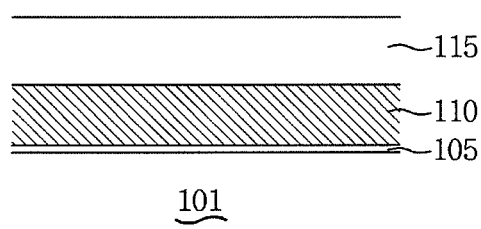
FIGS. 4A to 4P are cross-sectional views illustrating a method of fabricating a semiconductor device according to an embodiment of the inventive concept.
Figure 4B:
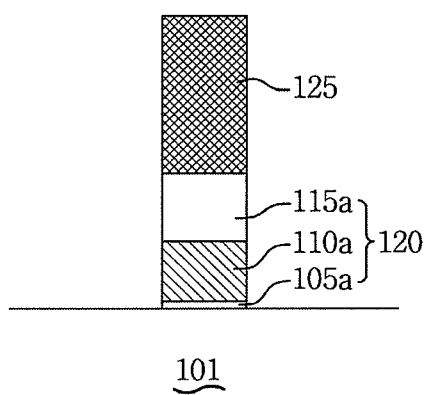
Figure 4C:
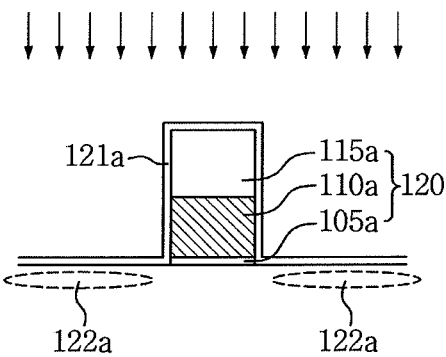
Figure 4D:
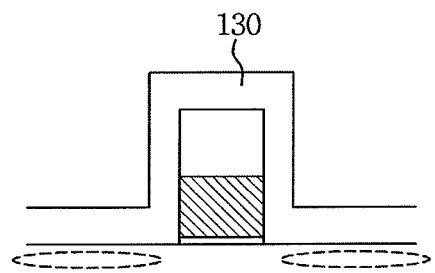
Figure 4E:
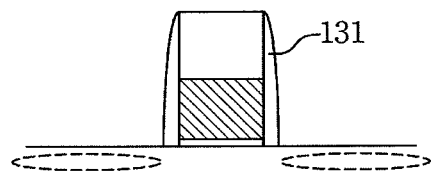
Figure 4F:
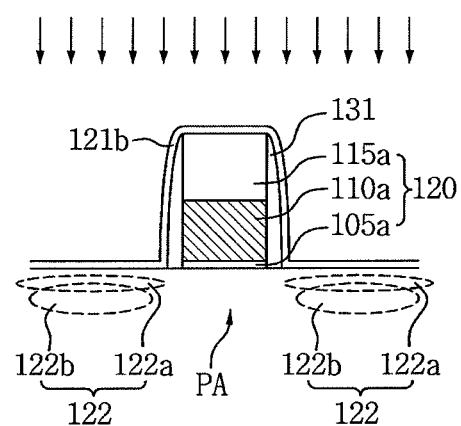
Figure 4G:
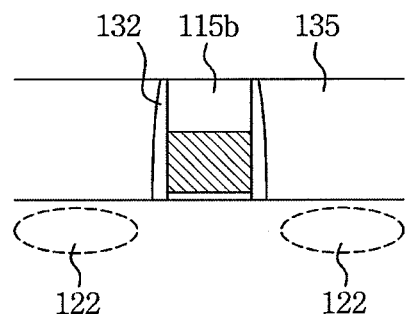
Figure 4H:
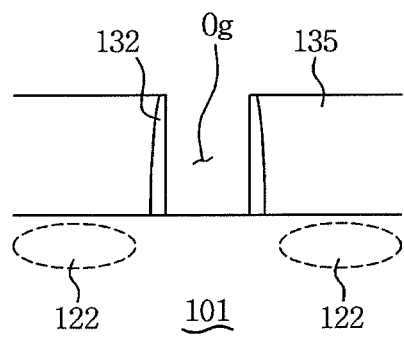
Figure 4I:
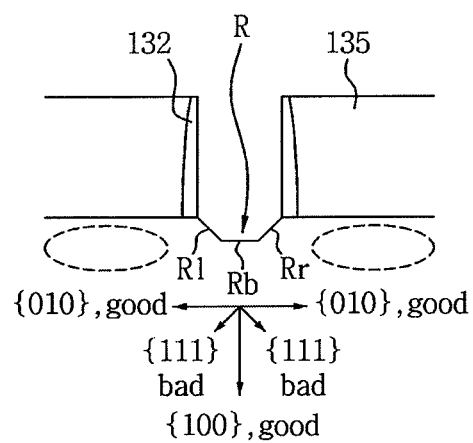
Figure 4J:
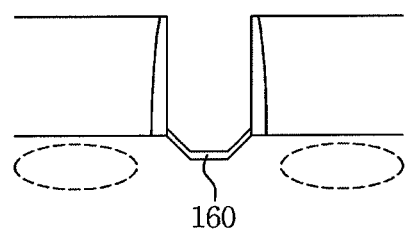
Figure 4K:
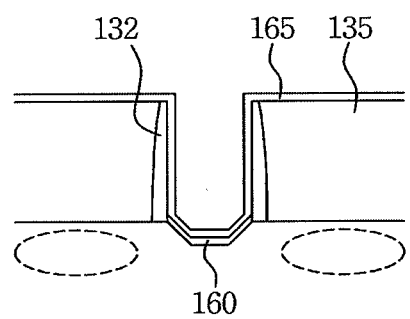
Figure 4L:
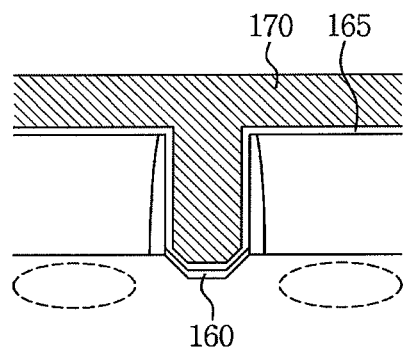
Figure 4M:
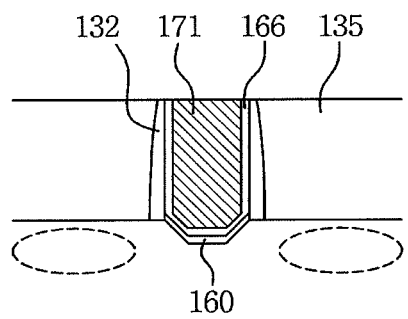
Figure 4N:
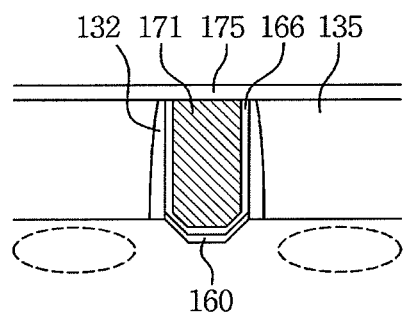
Figure 4O:
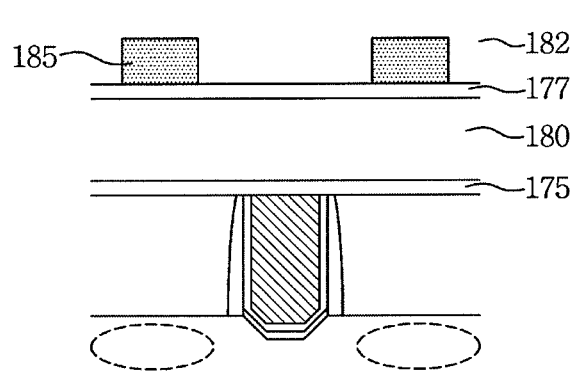
Figure 4P:
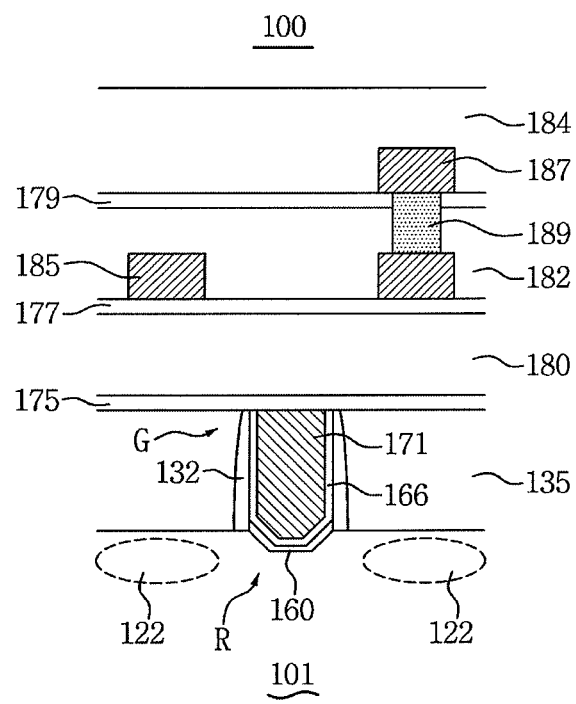

FIGS. 4A to 4P illustrate a method of fabricating a semiconductor device according to the inventive concept. Referring to FIG. 4A, a first insulating layer 105, a first conductive layer 110 and a second insulating layer 115 are formed on a semiconductor substrate 101. The semiconductor substrate 101 may include silicon. For example, the substrate may be a single crystalline silicon having a top surface of one of a {100}, {010}, {001}, {110}, {101}, and {011} crystal orientation. The first insulating layer 105 may include silicon oxide, hafnium oxide, aluminum oxide, tantalum oxide or other oxides. The first conductive layer 110 may include polysilicon, metal-silicides or metals. The second insulating layer 115 may include silicon nitride or silicon oxynitride. For example, the first insulating layer 105 may include the same material as a gate insulating layer of a gate structure formed in a cell region of a memory semiconductor device, the first conductive layer 110 may include the same material as a gate electrode of the gate structure formed in the cell region of the memory semiconductor device, and the second insulating layer 115 may include the same material as a gate capping layer of the gate structure formed in the cell region of the memory semiconductor device. Therefore, a process of forming the first insulating layer 105 and a process of forming the gate insulating layer of the gate structure formed in the cell region of the memory semiconductor device may be simultaneously performed, a process of forming the first conductive layer 110 and a process of forming the gate electrode of the gate structure formed in the cell region of the memory semiconductor device may be simultaneously performed, and a process of forming the second insulating layer 115 and a process of forming the gate capping layer of the gate structure formed in the cell region of the memory semiconductor device may be simultaneously performed.

Referring to FIG. 4B, a first patterning mask 125 for forming a dummy gate pattern 120 is formed on the second insulating layer 115. Then, the second insulating layer 115, the first conductive layer 110 and the first insulating layer 105 are patterned using the first patterning mask 125 as a patterning mask to form the dummy gate pattern 120. The dummy gate pattern 120 includes a dummy gate insulating layer 105*a*, a dummy gate electrode 110*a*, and a dummy gate capping layer 115*a*. The first patterning mask 125 may be a photoresist pattern. During the process, a part of the semiconductor substrate 101 may be exposed. The dummy gate pattern 120 may be formed in the shape of a tower or wall.

Referring to FIG. 4C, as the first ion implanting process, impurity ions may be implanted into the semiconductor substrate 101 using the dummy gate pattern 120 as an ion implantation mask, referring the arrows. During the first ion implanting process, first source/drain regions 122*a* having a first concentration may be formed. Depending on a polarity of a transistor to be formed, p- or n-type impurity ions may be implanted. For example, when a PMOS transistor is intended to be formed, Boron (B) may be implanted, and when an NMOS transistor is intended to be formed, Phosphorus (P) and/or Arsenic (As) may be implanted. During the first ion implanting process, a first ion implantation buffer layer 121*a* covering surfaces of the semiconductor substrate 101 and the dummy gate pattern 120 may be formed. The first ion implantation buffer layer 121*a* may include silicon oxide. The first ion implanting process may be selectively performed. That is, this process may be omitted. After ions are implanted, the first ion implantation buffer layer 121*a* may be removed. For example, the first ion implantation buffer layer 121*a* may be removed through a process of removing silicon oxide or a cleansing process.

Referring to FIG. 4D, a spacer insulating layer 130 covering the semiconductor substrate 101 and the dummy gate pattern 120 may be conformably formed. The spacer insulating layer 130 may include silicon nitride or silicon oxynitride. Alternatively, the spacer insulating layer 130 may be formed in a multilayer structure including two or more layers. For example, a silicon oxide layer is formed, and then silicon nitride is formed thereon, so that the spacer insulating layer 130 may be formed. In addition, silicon oxide and silicon nitride may be alternately stacked to form three layers or more, so that the spacer insulating layer 130 may be formed. As an application example of the inventive concept, the first ion implantation buffer layer 121a may be used as a part of the spacer insulating layer 130.

Referring to FIG. 4E, gate spacers 131 are formed. The gate spacers 131 may be formed by anisotropically etching the spacer insulating layer 130.

Referring to FIG. 4F, as the second ion implanting process, impurity ions may be implanted once again using the gate spacers 131 and the dummy gate pattern 120 as ion implantation masks, referring the arrows. During the second ion implanting process, second source/drain regions 122b may be formed. The second source/drain regions 122b may have a higher ion concentration and deeper ion distribution regions than the first source/drain regions 122a. Specifically, the second source/drain regions 122b may be implanted under a higher dose and accelerating voltage than the first source/drain regions 122a. Afterwards, each pair of the first and the second source/drain regions 122a and 122b may be formed as diffused source/drain regions 122. It will be illustrated as the diffused source/drain regions 122 below. The impurity ions to be implanted may be a p- or n-type depending on a polarity of a transistor to be formed. For example, when a PMOS transistor is intended to be formed, B may be implanted, and when an NMOS transistor is intended to be formed, P and/or As may be implanted. Also, during the second ion implanting process, a second ion implantation buffer layer 121b covering the semiconductor substrate 101, the gate spacers 131 and the dummy gate pattern 120 may be formed. The second ion implantation buffer layer 121b may include silicon oxide. This process may be selectively performed. For example, the second ion implanting process may be omitted.

Referring to FIG. 4G; as the first planarization process, after an insulating material is formed to a sufficient thickness, a planarization process such as chemical mechanical polishing (CMP) or etch back may be performed to form a first interlayer insulating layer 135. During the first planarization process, top end portions of the gate spacers 132 and the dummy gate capping layer 115b may be partially planarized. That is, the first interlayer insulating layer 135, the gate spacers 132 and the dummy gate capping layer 115b may be formed to have the same surface level.

Referring to FIG. 4H, the dummy gate capping layer 115b, the dummy gate electrode 110a and the dummy gate insulating layer 105a may be removed, so that a gate opening Og is formed. A surface of the semiconductor substrate 101 may be exposed within the gate opening Og.

Referring to FIG. 4I, a recessed portion R is formed on the surface of the semiconductor substrate 101 within the gate opening Og. The recessed portions R includes a bottom surface Rb, a left side surface Rl and a right side surface Rr. The bottom surface Rb may be formed parallel to the surface of the semiconductor substrate 101. For example, it may be formed to be flat in a horizontal direction. The left side surface Rl and the right side surface Rr may include surfaces oblique to the bottom surface Rb at a predetermined angle. The predetermined angle may be about 54.74°. For example, when the semiconductor substrate 101 has a top surface of one of a $\{100\}$, $\{010\}$, $\{001\}$, $\{110\}$, $\{101\}$, and $\{011\}$ crystal orientation, the left side surface Rl and the right side surface Rr may be formed in a $\{111\}$ crystal orientation. The semiconductor substrate 101 may be etched using an etching method having a different etch rate depending on the crystal orientations, so that the recessed portion R may be formed. For example, when the semiconductor substrate 101 is wet etched using ammonia water ($NH_4OH$) and the semiconductor substrate 101 has a top surface of a $\{100\}$ crystal orientation, a higher etch rate is obtained in the $\{100\}$, $\{010\}$, $\{001\}$, $\{110\}$, $\{101\}$, or $\{011\}$ crystal orientations, and a lower etch rate is obtained in the $\{111\}$ crystal orientation. Therefore, as illustrated, the recessed portion R in the shape of a trench including a flat surface in each direction may be formed. In this process, an —OH group in the liquid-phase ammonia water is excited to be utilized as an etchant etching the semiconductor substrate 101.

Referring to FIG. 4J, a first gate insulating layer 160 is formed on the semiconductor substrate 101 exposed to the recessed portion R. The first gate insulating layer 160 may include silicon oxide. For example, the first gate insulating layer 160 may be formed by oxidizing the surface of the semiconductor substrate 101 exposed on the recessed portion R. In the inventive concept, during this process, a process using ozone ($O_3$) may be applied. In particular, when the exposed semiconductor substrate 101 is wet oxidized using ozone water, an oxidation rate in the $\{111\}$ crystal orientation is higher than that in the $\{100\}$, $\{010\}$, $\{001\}$, $\{110\}$, $\{101\}$ or $\{011\}$ crystal orientation. That is, referring to FIGS. 1A and 1B, the first gate insulating layer 160 may be formed thicker on both side surfaces Rl and Rr than the bottom surface Rb of the recessed portion R.

Referring to FIG. 4K, a second gate insulating layer 165 may be formed on the first gate insulating layer 160. The second gate insulating layer 165 may be conformably formed on the first gate insulating layer 160, sidewalls of the gate spacers 132 and surface of the first interlayer insulating layer 135. The second gate insulating layer 165 may be formed using CVD, etc. The second gate insulating layer 165 may include silicon oxide ($SiO_2$), hafnium oxide (HfO), aluminum oxide ($Al_2O_3$), tantalum oxide (TaO) or other insulating materials. The second gate insulating layer 165 may include an insulating material having a higher dielectric constant than the first gate insulating layer 160.

Referring to FIG. 4L, a metal layer 170 may be formed on the second gate insulating layer 165. The metal layer 170 may be formed to completely fill the gate opening Og. The metal layer 170 may include at least one selected from metals, metal silicides and metal compounds. For example, the metal layer 170 may include at least one among TiN, aluminum, tungsten, cobalt, copper or other refractory metals.

Referring to FIG. 4M, a gate electrode 171 is formed. The gate electrode 171 may be formed by planarizing the metal layer 170. For example, the gate electrode 171 may be formed by performing a planarization process such that the metal layer 170 remains only within the gate opening Og. During this planarization process, surfaces of the first interlayer insulating layer 135, the gate spacers 132 and the second gate insulating layer 166 may be exposed.

Referring to FIG. 4N, a first stopper layer 175 may be formed on the entire surface. As previously described, the first stopper layer 175 may include an insulating material denser than the first interlayer insulating layer 135. For example, the first stopper layer 175 may include silicon nitride or silicon oxynitride.

Referring to FIG. 4O, a second interlayer insulating layer 180, a second stopper layer 177, a third interlayer insulating layer 182 and interconnections 185 may be formed. The second interlayer insulating layer 180 and the third interlayer insulating layer 182 may include a material the same as or similar to the first interlayer insulating layer 135, and the second stopper layer 177 may include a material the same as or similar to the first stopper layer 175. The interconnections 185 may include polysilicon, metals, metal silicides or metal compounds, and may include a metal diffusion barrier layer.

Referring to FIG. 4P, a third stopper layer 179 may be formed on the third interlayer insulating layer 182. A fourth interlayer insulating layer 184 may be formed on the third stopper layer 179. The first to fourth interlayer insulating layers 135, 180, 182 and 184 may have better planarization characteristics than the first to third stopper layers 175, 177 and 179. For example, the first to fourth interlayer insulating layers 135, 180, 182 and 184 may include silicon oxide such as tetra ethyl ortho silicate (TEOS), tonen silazene (TOSZ), SiCHO, BPSG, USG, etc. The first to third stopper layers 175, 177 and 179 may have denser characteristics than the first to fourth interlayer insulating layers 135, 180, 182 and 184. For example, the first to third stopper layers 175, 177 and 179 may include silicon nitride or silicon oxynitride. Metal interconnections 185 and 187 may be formed on the second stopper layer 177 or the third stopper layer 179. The metal interconnection 185 may be formed to be covered with one of the second to fourth interlayer insulating layers 180, 182 and 184. Alternatively, the metal interconnection 187 may penetrate the first to third stopper layers 175, 177 and 179 to be formed on the first to fourth interlayer insulating layers 135, 180, 182 and 184. A conductive contact plug 189 may vertically penetrate one of the second to fourth interlayer insulating layers 180, 182 and 184. While it is illustrated in the drawing that the contact plug 189 is formed between the metal interconnections 185 and 187, it may be formed between the semiconductor substrate 101 and the metal interconnections 185 and 187 or between the gate electrode 171 and the metal interconnections 185 and 187.

Figure 5A:
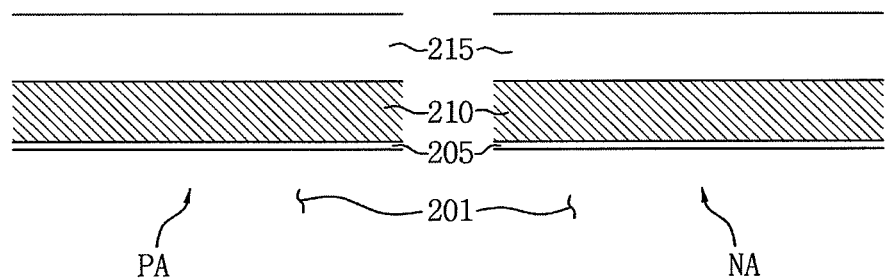
FIGS. 5A to 5Y are cross-sectional views illustrating a method of fabricating a semiconductor device according to an embodiment of the inventive concept.
Figure 5B:
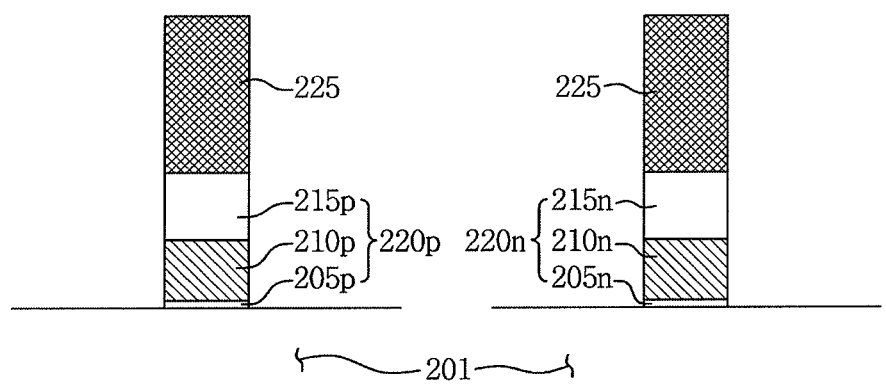
Figure 5C:
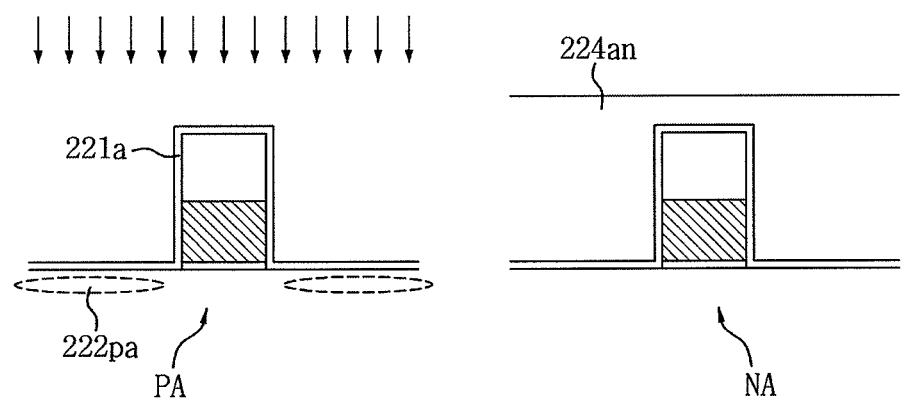
Figure 5D:
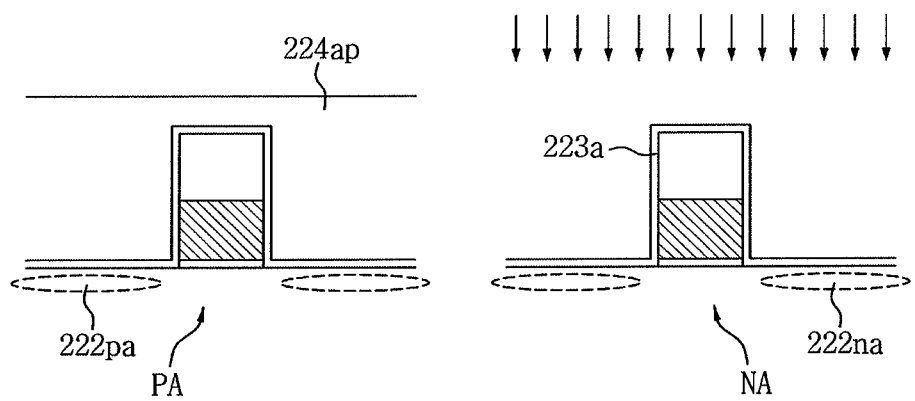
Figure 5E:
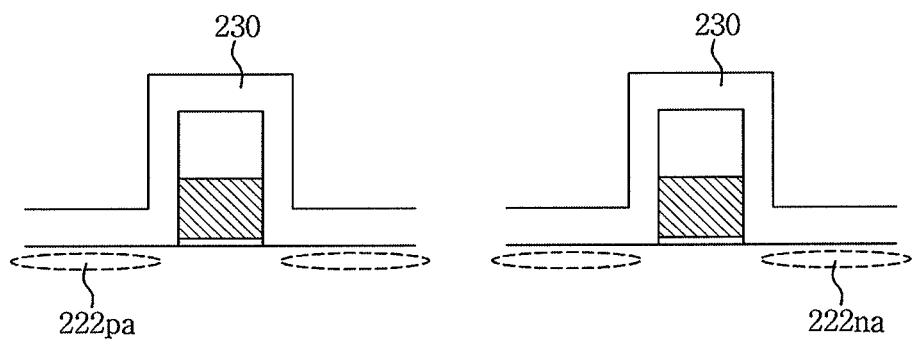
Figure 5F:
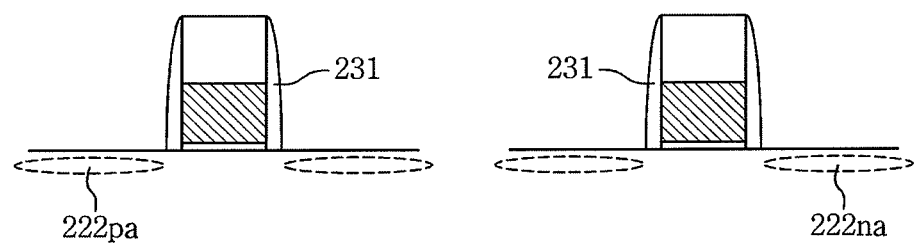
Figure 5G:
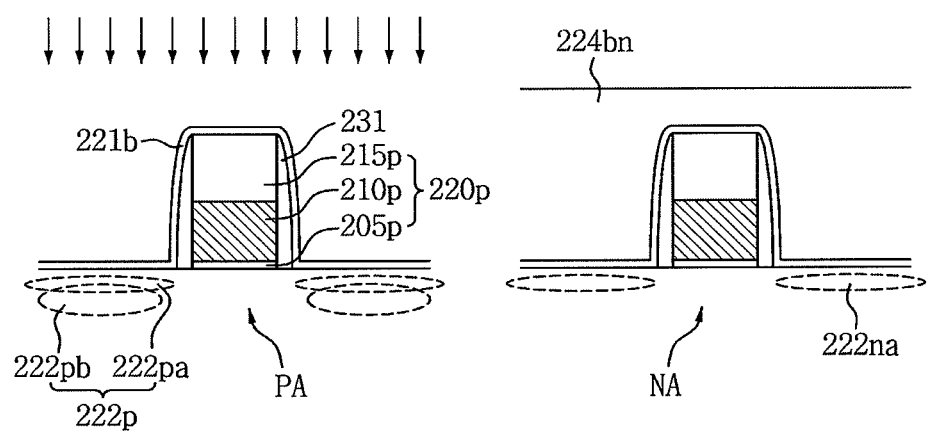
Figure 5H:
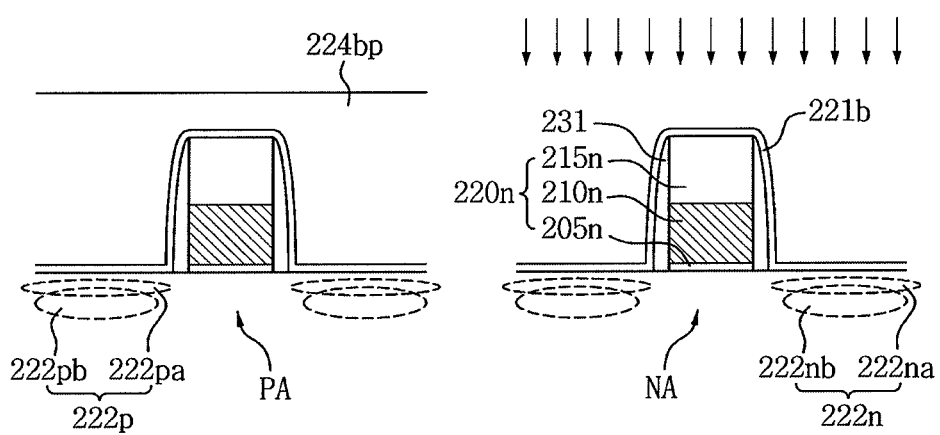
Figure 5I:
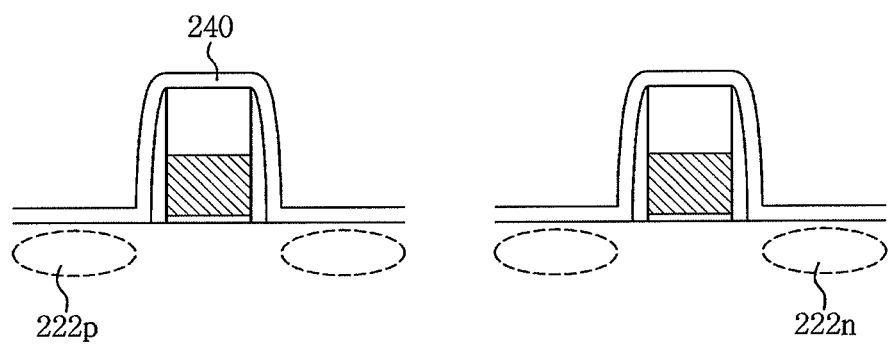
Figure 5J:
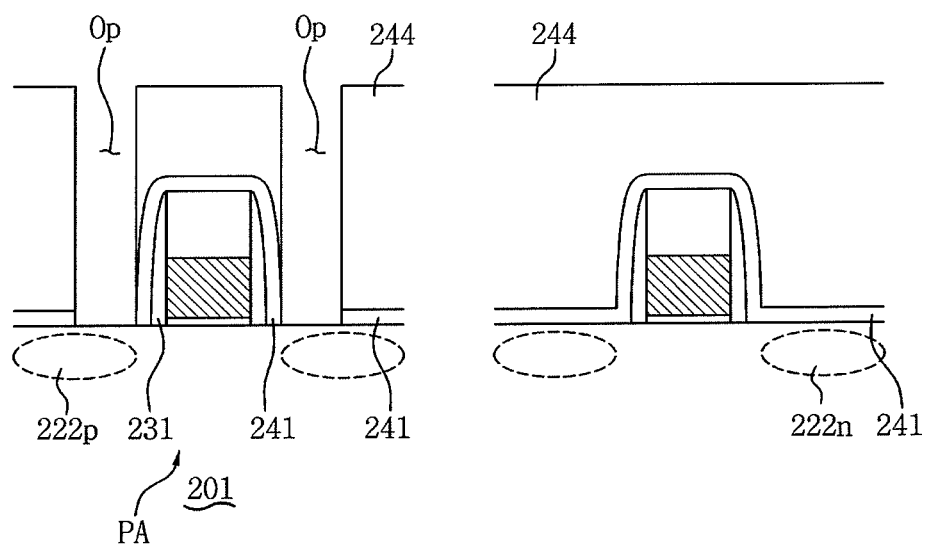
Figure 5K:
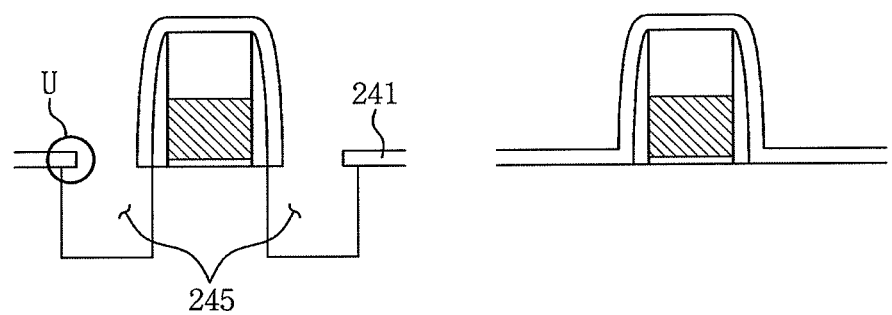
Figure 5L:
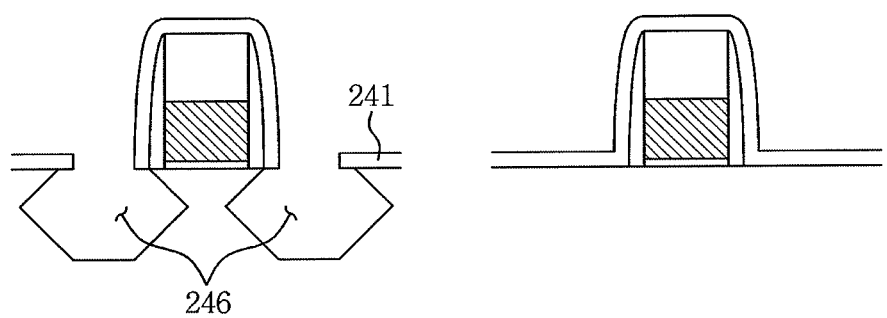
Figure 5M:
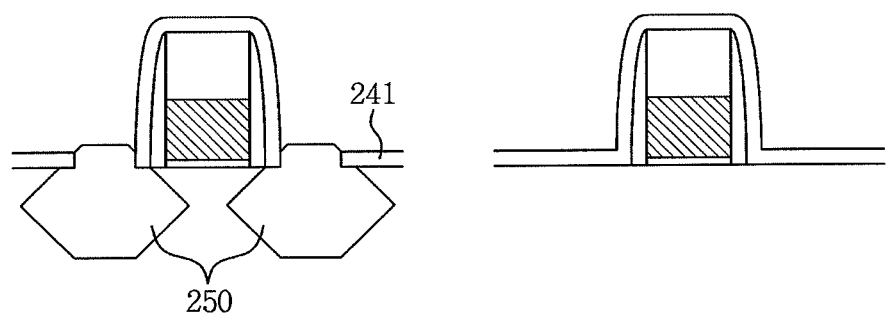
Figure 5N:
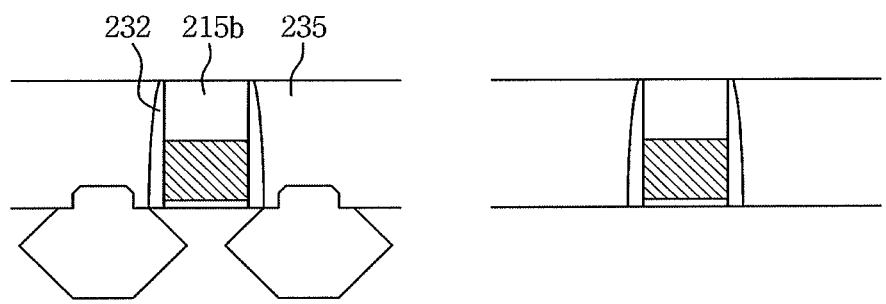
Figure 5O:
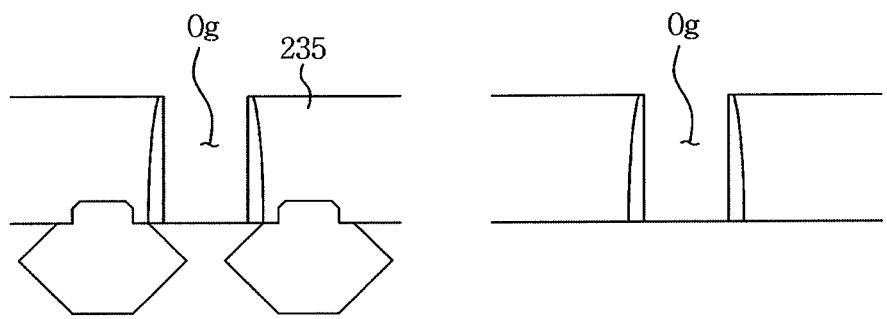
Figure 5P:
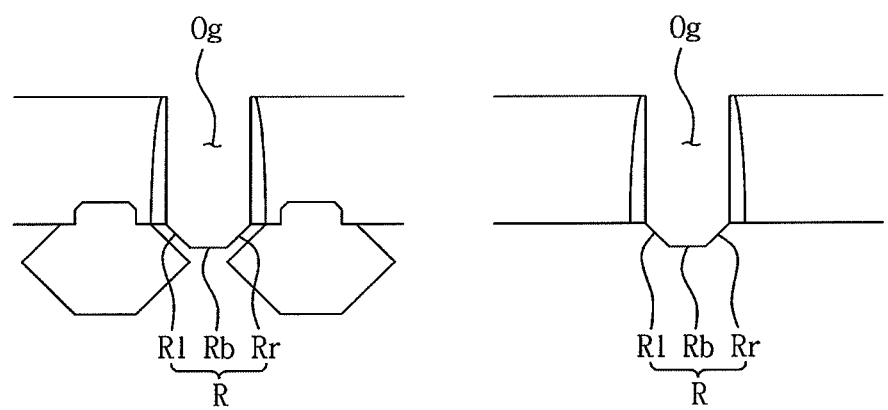
Figure 5Q:
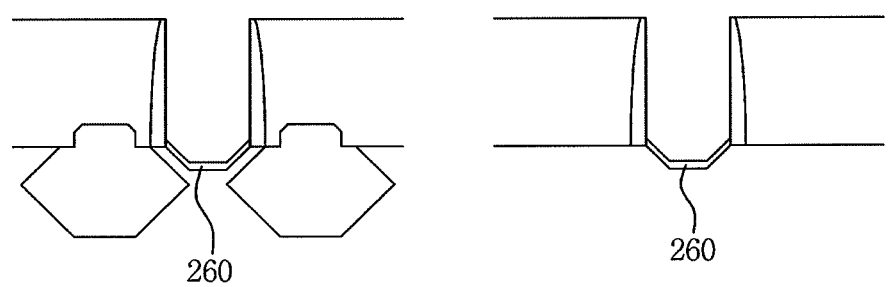
Figure 5R:
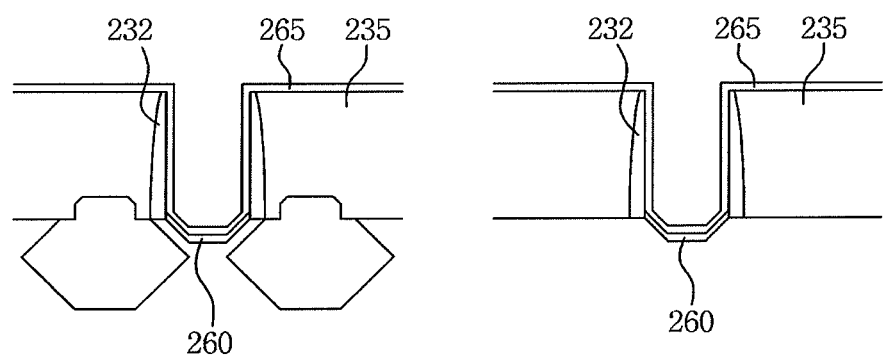
Figure 5S:
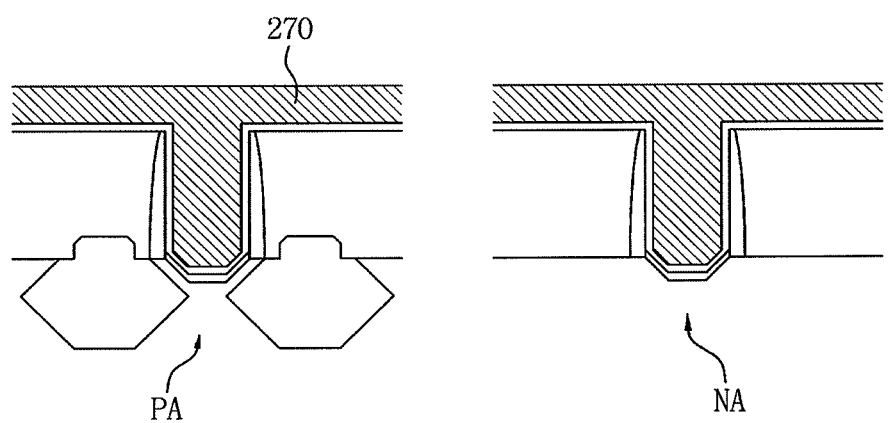
Figure 5T:
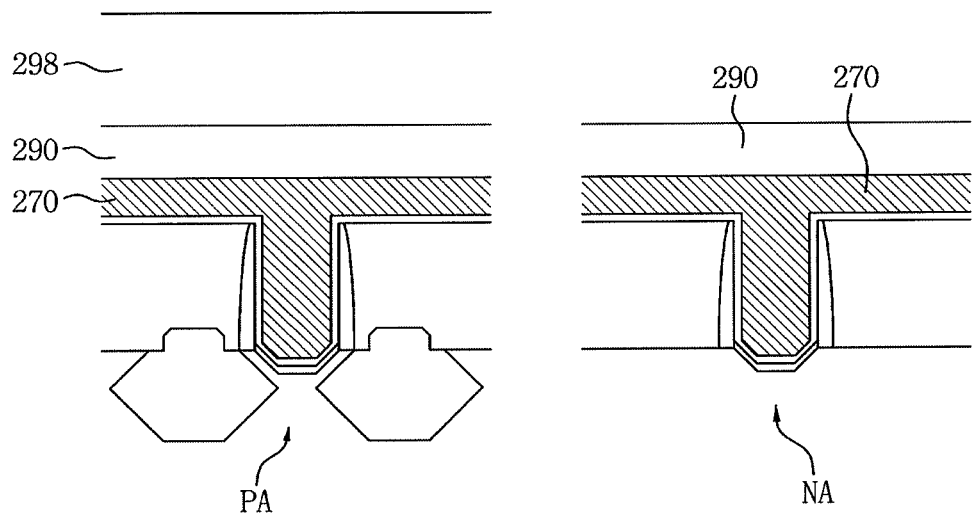
Figure 5U:
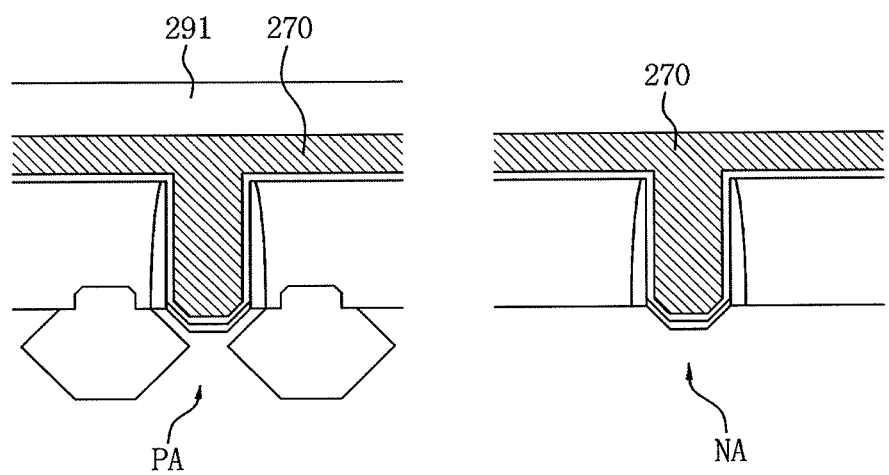
Figure 5V:
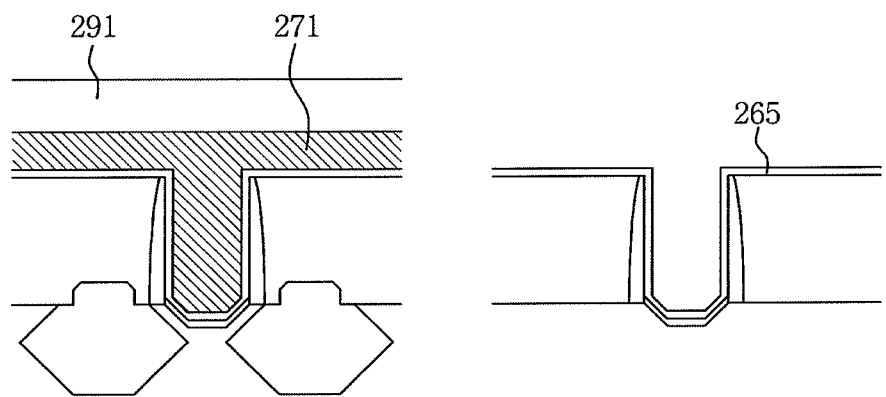
Figure 5W:
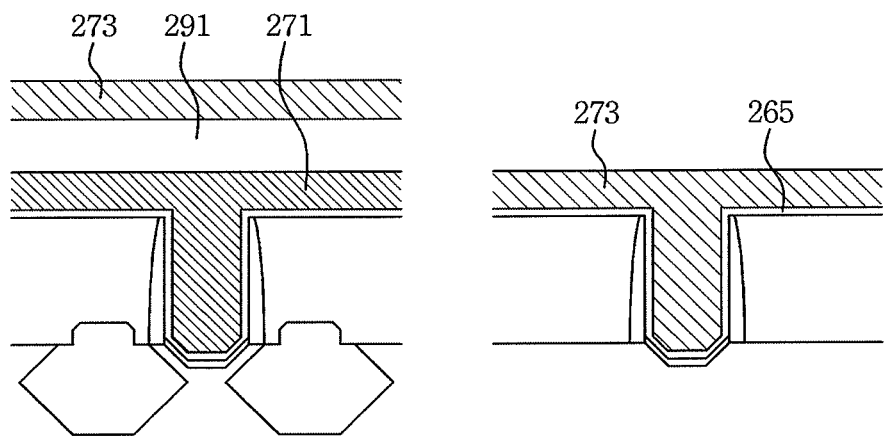
Figure 5X:
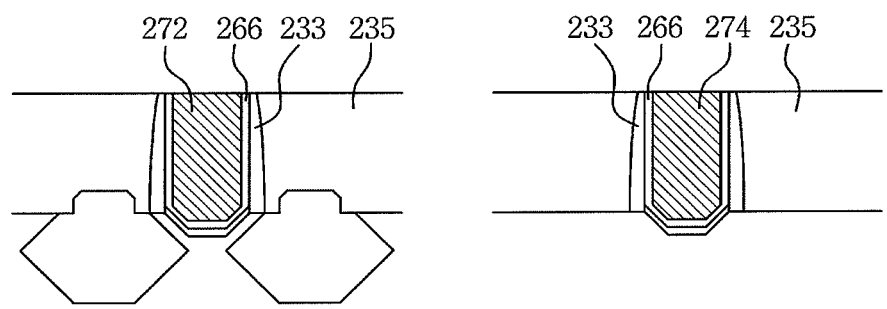
Figure 5Y:
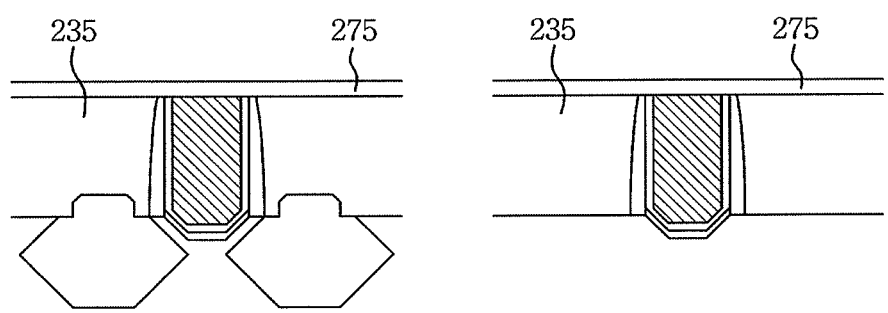

FIGS. 5A to 5Y are cross-sectional views illustrating a method of fabricating a semiconductor device according to the inventive concept. Referring to FIG. 5A, a first insulating layer 205, a first conductive layer 210 and a second insulating layer 215 are formed on the entire surface of a semiconductor substrate 201 having a PMOS transistor area PA and an NMOS transistor area NA. This process may be further specifically understood with reference to FIG. 4A and the description thereof.

Referring to FIG. 5B, a first patterning mask 225 for forming dummy gate patterns 220p and 220n is formed on the second insulating layer 215, and the dummy gate patterns 220p and 220n are formed using the first patterning mask 225 as an etch mask. This process may be further specifically understood with reference to FIG. 4B and the description thereof.

Referring to FIGS. 5C and 5D, area opening patterns 224an and 224ap selectively exposing the NMOS transistor area NA or the PMOS transistor area PA are formed, and impurity ions are implanted into the semiconductor substrate 201 using the dummy gate patterns 220p and 220n as ion implantation masks. During the processes, source/drain regions 222pa and 222na having low concentrations may be formed. The impurity ions to be implanted may be a P- or N-type depending on a polarity of a transistor to be formed. Further, ion implantation buffer layers 221a and 223a covering the semiconductor substrate 201 and the dummy gate patterns 220p and 220n may be entirely or selectively formed. The ion implantation buffer layers 221a and 223a may be the same layer or different layers. After each ion implantation process is performed, the ion implantation buffer layers 221a and 223a may be removed. For example, the ion implantation buffer layers 221a and 223a may be removed through a process of removing silicon oxide or a cleansing process. Performing an ion implantation process illustrated in FIG. 5C and that illustrated in FIG. 5D may be orderly changed. The area opening patterns 224an and 224ap may be photoresist. These processes may be further specifically understood with reference to FIG. 4C and the description thereof.

Referring to FIG. 5E, a spacer insulating layer 230 covering the semiconductor substrate 201 and the dummy gate patterns 220p and 220n may be conformably formed. The spacer insulating layer 230 may include silicon nitride. Alternatively, the spacer insulating layer 230 may include in a multilayer structure consisting of two or more layers. For example, a silicon nitride layer may be formed, and then silicon nitride may be formed thereon to form the spacer insulating layer 230. As an application example of the inventive concept, the ion implantation buffer layers 221a and 223a may be used as a part of the spacer insulating layer 230. In addition, the silicon oxide and silicon nitride may be alternately stacked to form three layers or more, so that the spacer insulating layer 230 may be formed. This process may be further specifically understood with reference to FIG. 4D and the description thereof.

Referring to FIG. 5F, gate spacers 231 are formed. The gate spacers 231 may be formed by anisotropically etching the spacer insulating layer 230. The gate spacers have sharp top ends. This process may be further specifically understood with reference to FIG. 4E and the description thereof.

Referring to FIGS. 5G and 5H, area opening patterns 224bn and 224bp selectively exposing the NMOS transistor area NA or the PMOS transistor area PA are formed, and impurity ions are implanted into the semiconductor substrate 201 using the dummy gate patterns 220p and 220n as ion implantation masks. During the processes, source/drain regions 222pb and 222nb having high concentrations may be formed. The impurity ions to be implanted may be a P- or N-type depending on a polarity of a transistor to be formed. Afterwards, each pair of the source/drain regions 222pa, 222pb, 222na, and 222nb may be formed as diffused source/drain regions 222p and 222n. It will be illustrated as the diffused source/drain regions 222p and 222n below. Further, ion implantation buffer layers 221b and 223b covering the semiconductor substrate 201 and the dummy gate patterns 220p and 220n may be entirely or selectively formed. The ion implantation buffer layers 221b and 223b may be the same layer or different layers. After each ion implantation process is performed, the ion implantation buffer layers 221b and 223b may be removed. For example, the ion implantation buffer layers 221b and 223b may be removed through a process of removing silicon oxide or a cleansing process. Performing an ion implantation process illustrated in FIG. 5G and that illustrated in FIG. 5H may be orderly changed. The area opening patterns 224bn and 224bp may be photoresist. These processes may be further specifically understood with reference to FIG. 4F and the description thereof.

Referring to FIG. 5I, a first hard mask layer 240 is formed on the entire surface. The first hard mask layer 240 may be conformably formed of silicon oxide.

Referring to FIG. 5J, a second patterning mask 244 is formed. The second patterning mask 244 may include openings Op selectively exposing the first hard mask layer 240 on the outside of the gate spacer 231 of the PMOS transistor area PA. The second patterning mask 244 may be photoresist. Afterwards, the first hard mask layer 240 exposed within the openings Op may be removed using the second patterning mask 244 as an etch mask, so that the surface of the semiconductor substrate 201 may be exposed. For example, the first hard mask layer 240 may be formed as a first hard mask layer 241 including open regions. Then, the second patterning mask 244 may be removed. The source/drain regions 222p and 222n may be omitted for clarity of the drawings.

Referring to FIG. 5K, the exposed surface of the semiconductor substrate 201 may be etched using the second hard mask layer 241 as an etch mask, so that trenches 245 may be formed. Sidewalls of the trenches 245 may be nearly vertically formed. Bottom surfaces of the trenches 245 may be formed to be flat as a whole or a part. This process may employ an anisotropic and/or isotropic dry etching process. While this process is performed, an undercut U may be formed under the first hard mask pattern 241.

Referring to FIG. 5L, embedded regions 246 are formed. This process may be performed using the first hard mask pattern 241 as an etch mask and using ammonia water ($NH_4OH$). For example, it may be understood that a low etch rate is exhibited in a direction oblique with respect to the surface of the semiconductor substrate 201, and a high etch rate is exhibited in a direction parallel and/or vertical to the surface of the semiconductor substrate 201 during the etching process. For example, the etching process using the ammonia water exhibits a deteriorated etching capability in the {111} silicon crystal orientation, and exhibits an enhanced etching capability in the {100}, {010}, {001}, {110}, {101}, or {011} crystal orientation. Therefore, this process may be controlled to form side surfaces of the embedded regions 246 like a shape of a single or twin sigma ($\Sigma$), mountains or angle brackets (< >) or a polygon such as a hexagon. The process may further include wet processes performed using SC-1, diluted HF and/or purified water. The embedded regions 246 are previously described in detail with reference to FIGS. 2A and 2B.

Referring to FIG. 5M, embedded source/drain regions 250 are formed. For example, a selective epitaxial growth (SEG) process may be performed on the embedded source/drain regions 250 to form the embedded source/drain regions 250 including SiGe. The embedded source/drain regions 250 may protrude more than the surface of the semiconductor substrate 201. The embedded source/drain regions 250 including SiGe may apply compressive stress to the semiconductor substrate 201. Compressive stress applied to the semiconductor substrate 201 may improve a hole mobility in a PMOS transistor. According to the inventive concept, stronger compressive stress is applied to a lower portion of a dummy gate pattern 220p formed in the PMOS transistor area PA. Therefore, performance of the PMOS transistor may be further enhanced. Afterwards, the first hard mask pattern 241 may be removed. In the drawing, the ideal shape of the embedded source/drain regions 250 is illustrated. According to the detailed process conditions, the embedded source/drain regions 250 may be formed in a slightly modified shape.

Referring to FIG. 5N, a first interlayer insulating layer 235 is formed on the entire surface. After the first interlayer insulating layer 235 is formed to a sufficient thickness, it may be formed to the same level as top ends of the gate spacers 232 and dummy gate capping layer 215b using a planarization process such as CMP or etch back. During the process, the gate spacers 232 and the dummy gate capping layer 215b may include a flat surface on the top ends. This process may be further specifically understood with reference to FIG. 4G and the description thereof.

Referring to FIG. 5O, the gate openings Og are formed. The gate openings Og may be formed by removing the dummy gate patterns 220p and 220n. This process may be further specifically understood with reference to FIG. 4H and the description thereof.

Referring to FIG. 5P, surfaces of the semiconductor substrate 201 exposed within the gate openings Og may be etched to form recessed portions R. This process may be further specifically understood with reference to FIG. 4I and the description thereof.

Referring to FIG. 5Q, a first gate insulating layer 260 is formed on the semiconductor substrate 201 exposed within the recessed portion R. The first gate insulating layer 260 may include silicon oxide. For example, the first gate insulating layer 260 may be formed by oxidizing the surface of the semiconductor substrate 201 exposed within the recessed region R. This process may be further specifically understood with reference to FIG. 4J and the description thereof.

Referring to FIG. 5R, a second insulating layer 265 is formed on the first gate insulating layer 260. The second insulating layer 265 may be conformably formed on the first gate insulating layer 260, sidewalls of the gate spacers 232 and the first interlayer insulating layer 235. The second insulating layer 265 may be formed using CVD. The second insulating layer 265 may include $SiO_2$, HfO, $Al_2O_3$, TaO or an insulating material. The second insulating layer 265 may include an insulating material having a higher dielectric constant than the first gate insulating layer 260. This process may be further specifically understood with reference to FIG. 4K and the description thereof.

Referring to FIG. 5S, a first metal layer 270 may be formed on the second insulating layer 265. The first metal layer 270 may be formed to completely fill the gate opening Og. The first metal layer 270 may include at least one of metals, metal silicides and metal compounds. Specifically, it may include TiN, Al, W, Co, Cu or refractory metals. This process may be further specifically understood with reference to FIG. 4L and the description thereof.

Referring to FIG. 5T, a third hard mask layer 290 is formed on the first metal layer 270, and a third patterning mask 298 exposing an NMOS transistor area is formed on the third hard mask layer 290. The third hard mask layer 290 may include at least one among silicon oxide, silicon nitride, silicon oxynitride, etc., and the third patterning mask 298 may be photoresist.

Referring to FIG. 5U, the third hard mask layer 290 exposed in the NMOS transistor area NA may be removed. During this process, the first metal layer 270 may be exposed within the NMOS transistor area NA. Afterwards, the third patterning mask 298 may be removed.

Referring to FIG. 5V, the first metal layer 270 exposed in the NMOS transistor area NA may be removed using the third hard mask layer 291 as an etch mask. During this process, the second insulating layer 265 may be exposed.

Referring to FIG. 5W, a second metal layer 273 is formed on the second insulating layer 265. The second metal layer 273 may be formed on the third hard mask layer 291.

Referring to FIG. 5X, a planarization process is performed to form a first gate electrode 272 and a second gate electrode 273. During this process, the second metal layer 273, the third hard mask layer 291 and the first metal layer 271 are planarized, so that top ends of the first interlayer insulating layer 235, the gate spacers 233 and the second gate insulating layer 266 may be exposed.

Referring to FIG. 5Y, a first stopper layer 275 may be formed on the entire surface. The first stopper layer 275 may include an insulating material denser than the first interlayer insulating layer 235. For example, the first stopper layer 275 may include silicon nitride or silicon oxynitride. Afterwards, the processes described with reference to FIGS. 4O and 4P may be performed.

Figure 6A:
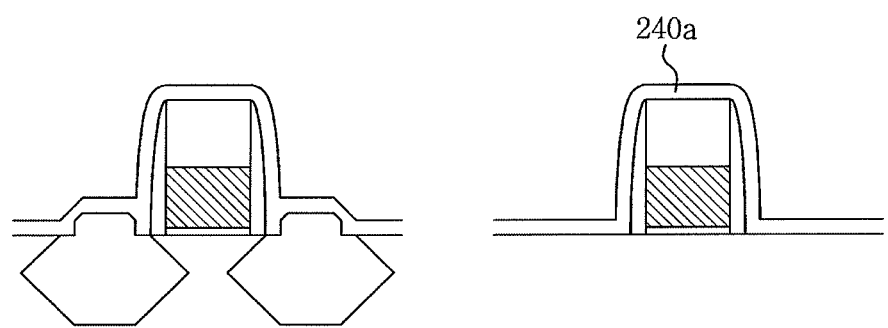
FIGS. 6A to 6E are cross-sectional views illustrating a method of fabricating a semiconductor device according to an embodiment of the inventive concept.

FIGS. 6A to 6E are cross-sectional views illustrating a method of fabricating a semiconductor device according to the inventive concept. Referring to FIG. 6A, after the processes described with reference to FIGS. 5A to 5M are performed, a fourth hard mask 240a may be formed. The process of forming the fourth hard mask 240a may be understood with reference to the process of forming the first hard mask layer 240 described with reference to FIG. 5I.

Figure 6B:
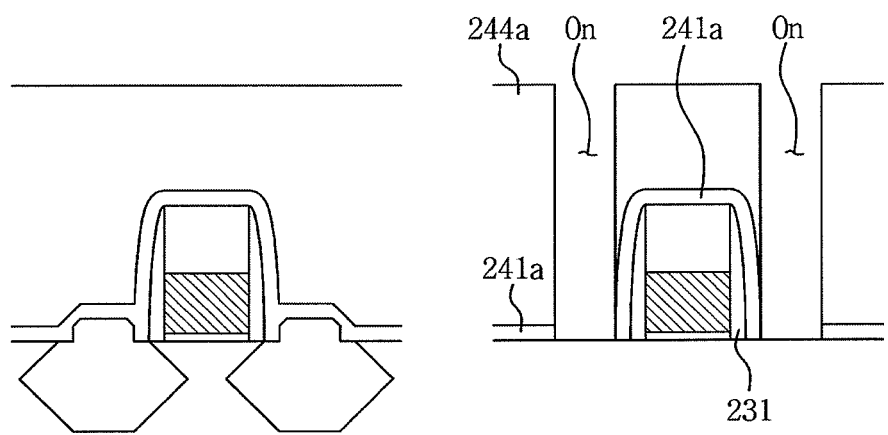

Referring to FIG. 6B, a fourth patterning mask 244a is formed. The fourth patterning mask 244a may include openings On selectively exposing the fourth hard mask layer 241a on the outside of the gate spacer 231 of the NMOS transistor area NA. The fourth patterning mask 244a may be photoresist. Then, the fourth hard mask layer 241a exposed within the openings On may be removed using the fourth patterning mask 244a as an etch mask, so that the surface of the semiconductor substrate 201 may be exposed. For example, the fourth hard mask layer 240a may be formed as a fourth hard mask layer 241a including open regions. Then, the fourth patterning mask 244a may be removed. This process may be further specifically understood with reference to FIG. 5J and the description thereof.

Figure 6C:
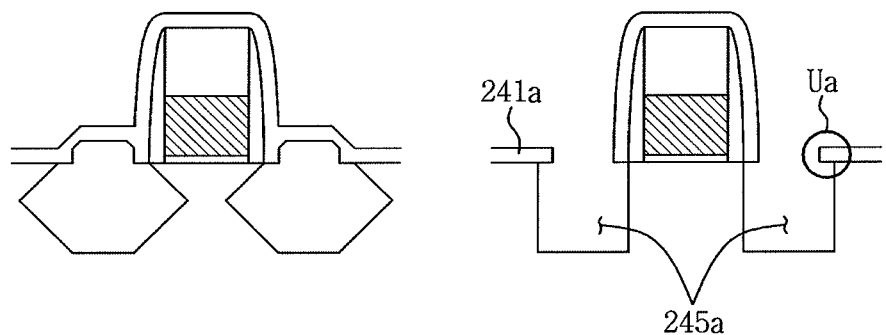

Referring to FIG. 6C, the exposed surface of the semiconductor substrate 201 may be etched using the fourth hard mask layer 241a as an etch mask to form trenches 245a. During this process, an undercut Ua may be formed under the fourth hard mask layer 241a. This process may be further specifically understood with reference to FIG. 5K and the description thereof.

Figure 6D:
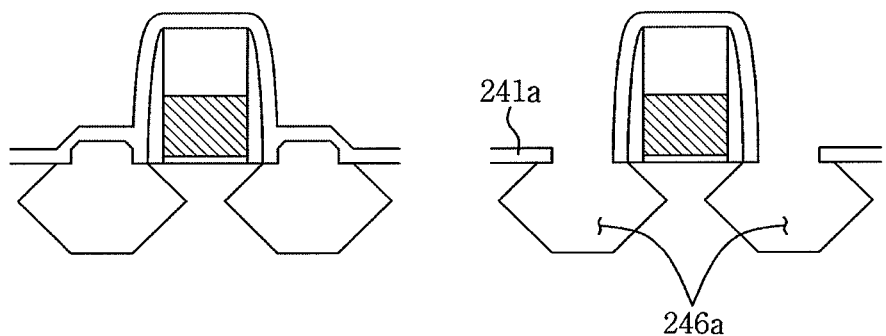

Referring to FIG. 6D, embedded regions 246a are formed. This process may be further specifically understood with reference to FIG. 5L and the description thereof.

Figure 6E:
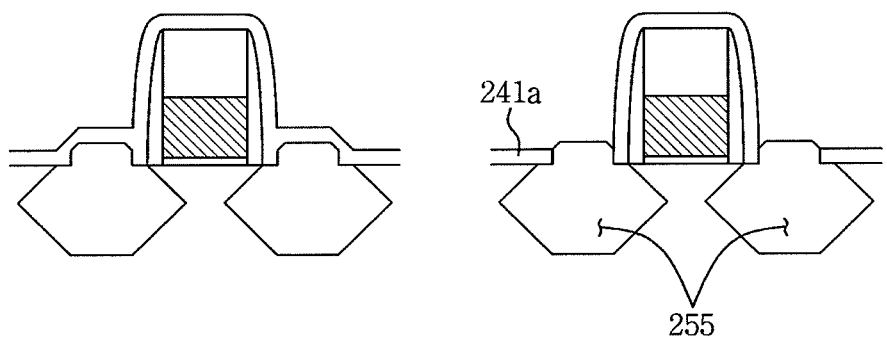

Referring to FIG. 6E, embedded source/drain regions 255 are formed. For example, an SEG process may be performed on the embedded source/drain regions 246a, so that the embedded source/drain regions 255 including SiC may be formed. This process may be specifically understood with reference to FIG. 5M and the description thereof. Afterwards, the processes described with reference to FIGS. 5N to 5Y may be performed.

Figure 7A:
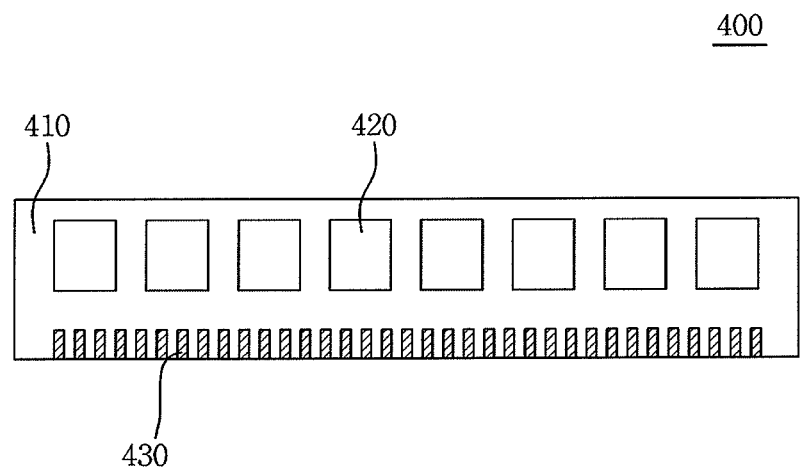
FIG. 7A is a schematic view of a semiconductor module including a semiconductor device according to an embodiment of the inventive concept.

FIG. 7A is a schematic view of a semiconductor module including a semiconductor device according to the inventive concept. Referring to FIG. 7A, a semiconductor module 400 on which a semiconductor device according to the inventive concept is mounted includes a module substrate 410, a plurality of semiconductor devices 420 disposed on the module substrate 410, and module contact terminals 430 formed parallel to one edge of the module substrate 410 and electrically connected to the semiconductor devices 420, respectively. The module substrate 420 may be a printed circuit board (PCB). Both sides of the module substrate 410 may be used. For example, the semiconductor devices 420 may be disposed on front and rear sides of the module substrate 410. While it is illustrated that the eight semiconductor devices 420 are disposed on the front side of the module substrate 410 in FIG. 7A, it is just for illustration. Also, a separate controller or chipset for controlling the semiconductor devices 420 or semiconductor packages may be further included. Therefore, the number of semiconductor devices 420 illustrated in FIG. 7A is not necessarily in the shape for constituting one semiconductor module 400. At least one of the semiconductor devices 420 may be one of the semiconductor devices 100a to 100d, 200a to 200d, and 300a to 300d according to the inventive concept. The module contact terminals 430 may include a metal and may have oxidation resistance. The module contact terminals 430 may be variously set depending on the standard specification of the semiconductor module 400. Therefore, the number of illustrated module contact terminals 430 is not significant.

Figure 7B:
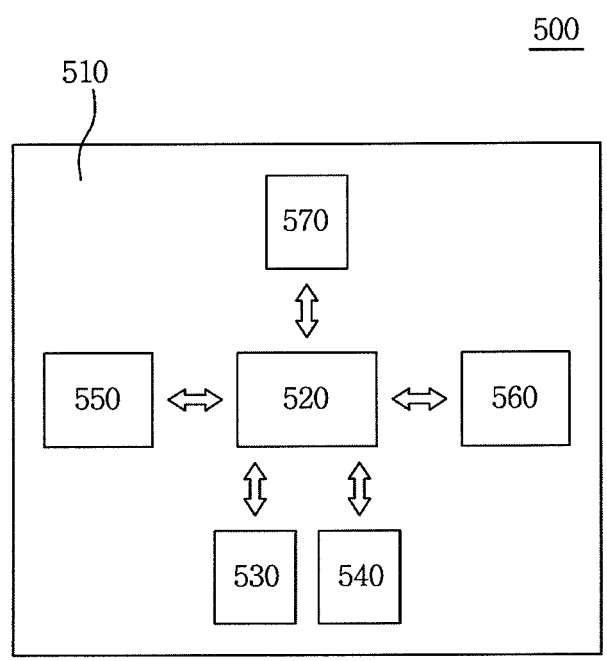
FIGS. 7B and 7C are schematic block diagrams of an electronic circuit board and electronic system including semiconductor devices or a semiconductor module including at least one of the semiconductor devices according to an embodiment of the inventive concept.

FIG. 7B is a schematic block diagram of an electronic circuit board including a semiconductor device according to the inventive concept.

Referring to FIG. 7B, an electronic circuit board 500 according to an embodiment of the inventive concept includes a microprocessor 520 disposed on a circuit board 510, a main storage circuit 530 and a supplementary storage circuit 540 communicating with the microprocessor 520, an input signal processing circuit 550 transmitting a command to the microprocessor 520, an output signal processing circuit 560 receiving a command from the microprocessor 520 and a communication signal processing circuit 570 transmitting and receiving an electrical signal to/from other circuit boards. The microprocessor 520 may receive and process various electrical signals, output the results, and control the other elements of the electronic circuit board 510. For example, it may be understood that the microprocessor 520 corresponds to a central processing unit (CPU) and/or a main control unit (MCU). The main storage circuit 530 may temporarily store data that the microprocessor 520 always or frequently requires or data before and after processing. The main storage circuit 530 requires a high-speed response, and thus may include a semiconductor memory. For example, the main storage circuit 530 may include a semiconductor memory referred to as a cache, a static random access memory (SRAM), a dynamic random access memory (DRAM), a resistive random access memory (RRAM) and applied semiconductor memories thereof, e.g., Utilized RAM, Ferro-electric RAM, Fast cycle RAM, Phase changeable RAM, Magnetic RAM, and other semiconductor memories. Furthermore, the main storage circuit 530 may include a volatile or non-volatile random access memory. In the embodiment, the main storage circuit 530 may include the semiconductor module 400 including at least one of the semiconductor devices 100a to 100d, 200a to 200d, and 300a to 300d according to the inventive concept. The supplementary storage circuit 540 is a high-capacity memory device, and may be a non-volatile semiconductor memory such as a flash memory or a hard disk drive using a magnetic field. Alternatively, the supplementary storage circuit 540 may be a compact disk drive using light. Compared to the main storage circuit 530, the supplementary storage circuit 540 does not require high speed, but it may be used to store high-capacity data. The supplementary storage circuit 540 may include a non-volatile memory device. The supplementary storage circuit 540 may include the semiconductor module 400 including at least one of the semiconductor devices 100a to 100d, 200a to 200d, and 300a to 300d according to the inventive concept. The input signal processing circuit 550 may convert an external command into an electrical signal or transfer an externally received electrical signal to the microprocessor 520. The externally received command or electrical signal may be an operation command, an electrical signal to be processed or data to be stored. The input signal processing circuit 550, e.g., may be a terminal signal processing circuit processing a signal transmitted from a keyboard, a mouse, a touch pad, an image recognition device or various sensors, an image signal processing circuit processing an input of an image signal from a scanner or camera, or various sensors or input signal interfaces. The input signal processing circuit 550 may include at least one of the semiconductor devices and the semiconductor module 400 including the semiconductor devices according to the inventive concept. The output signal processing circuit 560 may be an element for externally transmitting an electrical signal processed by the microprocessor 520. For example, the output signal processing circuit 560 may be a graphics card, an image processor, an optical converter, a beam panel card, or an interface circuit of various functions. The output signal processing circuit 560 may include the semiconductor module 400 including at least one of the semiconductor devices 100a to 100d, 200a to 200d, and 300a to 300d and according to the inventive concept. The communication signal processing circuit 570 is an element for directly transmitting or receiving an electrical signal to/from other electronic systems or other circuit boards without using the input signal processing circuit 550 and the output signal processing circuit 560. For example, the communication signal processing circuit 570 may be a modem of a personal computer system or various interface circuits. The communication signal processing circuit 570 may include the semiconductor module 400 including at least one of the semiconductor devices 100a to 100d, 200a to 200d, and 300a to 300d according to the inventive concept.

Figure 7C:
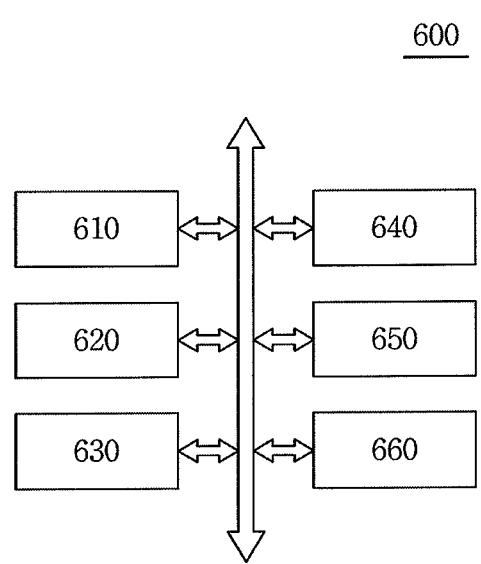

FIG. 7C is a schematic block diagram of an electronic system including the semiconductor module including at least one of the semiconductor devices according to the inventive concept.

Referring to FIG. 7C, an electronic system 600 according to an embodiment of the inventive concept may further include a control unit 610, an input unit 620, an output unit 630, a storage unit 640, a communication unit 650 and/or an operation unit 660. The control unit 610 may generally control the electronic system 600 and each unit. The control unit 610 may be understood as a central processing unit or a central control unit, and may include the electronic circuit board 500 according to the inventive concept. Also, the control unit 610 may include the semiconductor module 400 including at least one of the semiconductor devices 100a to 100d, 200a to 200d, and 300a to 300d according to the inventive concept. The input unit 620 may transmit an electrical command signal to the control unit 610. The input unit 620 may be a keyboard, a mouse, a touch pad, an image recognition device such as a scanner or various input sensors. The input unit 620 may include the semiconductor module 400 including at least one of the semiconductor devices 100a to 100d, 200a to 200d, and 300a to 300d according to the inventive concept. The output unit 630 may receive an electrical command signal from the control unit 610, and may output the result processed by the electronic system 600. The output unit 630 may be a monitor, a printer, a beam irradiator or various mechanical devices. The output unit 630 may include the semiconductor module 400 including at least one of the semiconductor devices 100a to 100d, 200a to 200d, and 300a to 300d according to the inventive concept. The storage unit 640 may be an element for temporarily or permanently storing an electrical signal to be processed or processed by the control unit 610. The storage unit 640 may be physically or electrically combined with the control unit 610. The storage unit 640 may be a semiconductor memory, a magnetic memory device such as a hard disk, an optical storage device such as a compact disk or a server having a data storage function. Furthermore, the storage unit 640 may include the semiconductor module 400 including at least one of the semiconductor devices 100a to 100d, 200a to 200d, and 300a to 300d according to the inventive concept. The communication unit 650 may receive an electrical command signal from the control unit 610 and may transmit or receive the received electrical signal to/from other electronic systems. The communication unit 650 may be a wired transceiver such as a modem and a LAN card, a wireless transceiver such as WiBro interface or an infrared port. Moreover, the communication unit 650 may include the semiconductor module 400 including at least one of the semiconductor devices 100a to 100d, 200a to 200d, and 300a to 300d according to the inventive concept. The operation unit 660 may physically or mechanically operate according to the command of the control unit 610. For example, the operation unit 660 may be an element that mechanically operates such as a plotter, an indicator, or an up/down operator. The electronic system according to the inventive concept may be a computer, a network server, a networking printer or scanner, a wireless controller, a mobile communication terminal, an exchanger or an electronic product that performs programmed operations.

As described above, according to the inventive concept, performance of a semiconductor device is improved as a whole, e.g., a driving capacity of the semiconductor device can be enhanced, and a leakage current can be reduced. Therefore, a highly integrated and high-performance semiconductor module exhibiting further excellent characteristics, an electronic circuit board and an electronic system can be implemented.

A method of implementing semiconductor device structures according to embodiments of the inventive concept is described as a whole. The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device comprising:
a semiconductor substrate having a top surface and a recessed portion including at least two oblique side surfaces and a first bottom surface between the at least two oblique side surfaces;
a gate insulating layer formed on the recessed portion;
a gate electrode formed on the gate insulating layer; and
a channel region formed below the at least two oblique side surfaces and the first bottom surface below the gate electrode in the semiconductor substrate,
wherein both the bottom surface and the side surfaces of the recessed portion include flat surfaces, and wherein the gate insulating layer has less thickness on the bottom surface than those on the side surfaces.

2. The device of claim 1, wherein the top surface has a {100}, {010}, {001}, {110}, {101}, or {011} crystal orientation, and the at least two side surfaces have a {111} crystal orientation.

3. The device of claim 1, wherein the gate insulating layer includes a first gate insulating layer on the recessed portion and a second gate insulating layer formed on the first gate insulating layer.

4. The device of claim 3, wherein the first gate insulating layer is formed of silicon oxide, and the second gate insulating layer is formed of an insulating material having a higher dielectric constant than that of the first gate insulating layer.

5. The device of claim 1, wherein the semiconductor substrate further includes a first embedded source/drain region, a second embedded source/drain region, and the channel region disposed between the first and second embedded source/drain regions.

6. The device of claim 5, wherein the first embedded source/drain region comprises a first upper side surface, a first lower side surface and a first intersection line between the first upper and lower side surfaces, and the second embedded source/drain region comprises a second upper side surface, a second lower side surface and a second intersection line between the second upper and lower side surfaces, wherein the first and second intersection lines are disposed lower than the first bottom surface.

7. The device of claim 6, wherein the first embedded source/drain region is distant from the second embedded source/drain region at a shortest distance between the first and second intersection lines.

8. The device of claim 6, wherein the first and second intersection lines run along and adjoin the channel region.

9. The device of claim 6, wherein an intersection angle between the first upper and lower side surfaces is less than 90 degree.

10. The device of claim 6, wherein the first embedded source/drain region is formed of epitaxially grown SiGe or SiC.

11. The device of claim 6, wherein each of the upper and lower side surfaces comprises a flat surface of {111} crystal orientation.

12. A semiconductor device comprising:
a semiconductor substrate including a first recess, wherein the first recess includes a first left side oblique surface, a first right side oblique surface, and a first bottom surface between the first left and the right side oblique surfaces and a second recess;
a first gate structure and a second gate structure formed on the first and second recesses, respectively;
a first embedded source/drain region including a first tip where a first upper side oblique surface and a first lower side oblique surface meet each other;
a second embedded source/drain region including a second tip where a second upper side oblique surface and a second lower side oblique surface meet each other; and
a channel region formed in the first left side oblique surface, the first right side oblique surface, and the first bottom surface, wherein the channel region formed in the first bottom surface is positioned between the first and the second tips and is adjacent to the first and the second tips, wherein the first gate structure comprise a PMOS transistor.

13. The device of claim 12, wherein the first upper side oblique surface and the first left side oblique surface are parallel with each other and the second upper side oblique surface and the first right side oblique surface are parallel with each other.

14. The device of claim 12, wherein the second recess comprises:
a second left side oblique surface;
a second right side oblique surfaces; and
a second bottom surface between the first left and right side oblique surfaces.

15. The device of claim 14, further comprising a third and a fourth embedded source/drain regions in the semiconductor substrate at both side portions of the second gate structure, wherein:
the third embedded source/drain regions comprises a third upper side oblique surface, a third lower side oblique surface and a third intersection line between the third upper and lower side oblique surfaces, and
the fourth embedded source/drain region comprises a fourth upper side oblique surface, a fourth lower side oblique surface and a fourth intersection line between the fourth upper and lower side oblique surfaces.

16. The device of claim 15, wherein the third upper side oblique surface and the second left side oblique surface are parallel with each other and the fourth upper side oblique surface and the second right side oblique surface are parallel with each other.

17. A semiconductor device comprising:
a semiconductor substrate including a first recess, wherein the first recess includes a first left side oblique surface, a first right side oblique surface, and a first bottom surface between the first left and the right side oblique surfaces and a second recess;
a first gate structure and a second gate structure formed on the first and second recesses, respectively;
a first embedded source/drain region including a first tip where a first upper side oblique surface and a first lower side oblique surface meet each other;
a second embedded source/drain region including a second tip where a second upper side oblique surface and a second lower side oblique surface meet each other; and
a channel region formed in the first left side oblique surface, the first right side oblique surface, and the first bottom surface, wherein the channel region formed in the first bottom surface is positioned between the first and the second tips and is adjacent to the first and the second tips, wherein the first and second embedded source/drain regions protrude from a top surface of the semiconductor substrate.

18. A semiconductor device comprising:
a semiconductor substrate having a top surface and a recessed portion including a first oblique side surface, a second oblique side surface, and a bottom surface between the first oblique side surface and the second oblique side surface;
a gate insulating layer formed on the recessed portion;
a gate electrode formed on the gate insulating layer;
a first embedded source/drain region having a first oblique upper side surface spaced apart from and in parallel with the first oblique side surface of the recessed portion; and
a second embedded source/drain region having a second oblique upper side surface spaced apart from and in parallel with the second oblique side surface of the recessed portion.

* * * * *